(12) United States Patent
Asghari et al.

(10) Patent No.: US 11,360,213 B2
(45) Date of Patent: Jun. 14, 2022

(54) LIDAR CHIP HAVING MULTIPLE COMPONENT ASSEMBLIES

(71) Applicant: SiLC Technologies, Inc., Monrovia, CA (US)

(72) Inventors: Mehdi Asghari, La Canada Flintridge, CA (US); Dazeng Feng, El Monte, CA (US); Bradley Jonathan Luff, La Canada Flintridge, CA (US)

(73) Assignee: SiLC Technologies, Inc., Monrovia, CA (US)

( * ) Notice: Subject to any disclaimer, the term of this patent is extended or adjusted under 35 U.S.C. 154(b) by 812 days.

(21) Appl. No.: 16/258,380

(22) Filed: Jan. 25, 2019

(65) Prior Publication Data
US 2019/0369244 A1  Dec. 5, 2019

Related U.S. Application Data

(60) Provisional application No. 62/680,787, filed on Jun. 5, 2018, provisional application No. 62/683,958, filed on Jun. 12, 2018.

(51) Int. Cl.
| | |
|---|---|
| *G01C 3/08* | (2006.01) |
| *G01S 17/06* | (2006.01) |
| *G02B 27/14* | (2006.01) |
| *G02B 27/09* | (2006.01) |
| *G01S 17/36* | (2006.01) |
| *G02B 6/122* | (2006.01) |
| *H01S 5/00* | (2006.01) |

(52) U.S. Cl.
CPC .............. *G01S 17/06* (2013.01); *G01S 17/36* (2013.01); *G02B 6/122* (2013.01); *G02B 27/0977* (2013.01); *G02B 27/14* (2013.01); *H01S 5/0085* (2013.01)

(58) Field of Classification Search
CPC ......... G01S 17/06; G01S 17/36; G02B 6/122; G02B 27/0977; G02B 27/14; H01S 5/0085
USPC ....................................................... 356/4.01
See application file for complete search history.

(56) References Cited

U.S. PATENT DOCUMENTS

| | | |
|---|---|---|
| 9,310,487 B2 | 4/2016 | Sakimura et al. |
| 9,753,351 B2 | 9/2017 | Eldada |
| 2015/0378187 A1 | 12/2015 | Heck et al. |
| 2017/0098917 A1 | 4/2017 | Popovic et al. |
| 2017/0371227 A1 | 12/2017 | Skirlo et al. |
| 2018/0031680 A1 | 2/2018 | Lee et al. |

OTHER PUBLICATIONS

Nickitas-Etienne, Athina, International Preliminary Report on Patentability and Written Opinion, The International Bureau of WIPO, PCT/US2019/035174, Dec. 17, 2020.
Kang, Sung Chul, International Search Report and Written Opinion, Korean Intellectual Property Office, PCT/US2019/035174, dated Sep. 25, 2019.

*Primary Examiner* — William Choi
(74) *Attorney, Agent, or Firm* — Gavrilovich, Dodd & Lindsey LLP

(57) ABSTRACT

The chip includes multiple component assemblies that are each configured to generate and steer a direction of a LIDAR output signal that exits from the chip. The LIDAR output signals generated by different components assemblies have different wavelengths.

20 Claims, 13 Drawing Sheets

| Parameter | Value | Unit |
|---|---|---|
| Range | 200 | m |
| Vertical AFOV (AngularField of View) | 30° | Degrees |
| Vertical Angular Resolution | 0.1° | Degrees |
| Horizontal AFOV (Angular Field of View) | 60° | Degrees |
| Horizontal Angular Resolution | 0.1° | Degrees |
| Frame refresh rate | 30 | Hz |

LIDAR CHIP HAVING MULTIPLE COMPONENT ASSEMBLIES

RELATED APPLICATIONS

This application claims the benefit of U.S. Provisional Patent Application Ser. No. 62/680,787, filed on Jun. 5, 2018, entitled "Optical Sensor Chip," and U.S. Provisional Patent Application Ser. No. 62/683,958, filed on Jun. 12, 2018, entitled "Optical Sensor Chip," each of which is incorporated herein in its entirety.

FIELD

The invention relates to optical devices. In particular, the invention relates to LIDAR chips.

BACKGROUND

There is an increasing commercial demand for 3D sensing systems that can be economically deployed in applications such as ADAS (Advanced Driver Assistance Systems) and AR (Augmented Reality). LIDAR (Light Detection and Ranging) sensors are used to construct a 3D image of a target scene by illuminating the scene with laser light and measuring the returned signal.

LIDAR systems typically steer a LIDAR output signal from to different sample regions in the field of view. The LIDAR data (distance and/or radial velocity between the LIDAR system and the object) are generated for the different sample regions illuminated by the LIDAR output signals. A variety of mechanisms are used to scan the LIDAR output signals. However, these mechanisms typically make use of moving parts such as the mirrors of MEMs devices. However, these devices are often not suitable for providing the high frequencies, repeatability, and long life that is need for LIDAR systems.

Additionally, many LIDAR applications such as self-driving cars require very high sampling rates. For instance, these applications require that the LIDAR data be generated for a very large number of sample regions in a very short period of time. As a result, there is a need for a LIDAR system with a solid-state scanning mechanism and/or that is capable of meeting these high sampling rates.

SUMMARY

A LIDAR chip includes one or more ridge waveguides having a ridge of a light-transmitting medium extending away from slab regions of the light-transmitting medium. The ridge has a width greater than 1 μm and less than 4 μm and a height greater than 1 μm and less than 4 μm. The slab regions have a thickness greater than 0.0 μm and less than 3 μm. In some instance, the chip is a silicon-on-insulator chip.

Another embodiment of a LIDAR chip includes a utility waveguide that guides an outgoing LIDAR signal to a facet through which the outgoing LIDAR signal exits from the chip. The chip also includes a control branch that removes a portion of the outgoing LIDAR signal from the utility waveguide. The control branch includes a control light sensor that receives a light signal that includes light from the removed portion of the outgoing LIDAR signal. The chip also includes a data branch that removes a second portion of the outgoing LIDAR signal from the utility waveguide. The data branch includes a light-combining component that combines a reference light signal that includes light from the second portion of the outgoing LIDAR signal with a comparative light signal that includes light that was reflected off of an object located off of the chip.

Another embodiment of the chip includes a utility waveguide that terminates at a facet through which an outgoing LIDAR signal exits from the chip. The utility waveguide is also configured to receive a LIDAR input light signal through the facet. The LIDAR input light signal includes light from the outgoing LIDAR signal. The chip also includes a data branch that includes a light sensor configured to receive a light signal that includes light from the LIDAR input light signal.

Another embodiment of the chip includes a utility waveguide that terminates at a facet through which at least a portion of an outgoing LIDAR signal exits from the LIDAR chip. The chip also includes an optical attenuator configured to attenuate an intensity of the outgoing LIDAR signal on the utility waveguide.

Another embodiment of the chip includes a waveguide that receives a comparative light signal that includes light from a LIDAR input light signal. The LIDAR input light signal includes light reflected by an object located off of the chip. The chip also includes an optical attenuator configured to attenuate an intensity of the comparative light signal on the waveguide.

Another embodiment of the chip includes multiple steering waveguides positioned on a base. Each of the steering waveguides is configured to carry an output signal. The steering waveguides each terminate at a facet. The facets are arranged such that output signals exit the chip through the facets and combine to form a LIDAR output signal. The chip also includes phase tuners positioned on at least a portion of the steering waveguides. The phase tuners are configured to tune a phase difference between the output signals on adjacent steering waveguides.

Another embodiment of the chip includes multiple steering waveguides positioned on a base. Each of the steering waveguides is configured to carry an output signal. The steering waveguides each terminate at a facet. The facets are arranged such that output signals exit the chip through the facets and combine to form a LIDAR output signal. The chip also includes phase tuners positioned on at least a portion of the steering waveguides. The phase tuners are configured to tune a phase difference between the output signals on adjacent steering waveguides. The steering waveguides have a diameter or a height greater than or equal to 1 μm and less than or equal to 4 μm.

Still another embodiment of the chip includes multiple component assemblies that are each configured to generate and steer a direction of a LIDAR output signal that exits from the chip. The LIDAR output signals generated by different components assemblies have different wavelengths. In some instances, the chip is configured such that the LIDAR output signals are independently steerable.

Another embodiment of the chip includes multiple component assemblies that are each configured to generate and steer a direction of a LIDAR output signal that exits from the chip. The chip is configured to generate N LIDAR output signals for resolving a field of view. N is greater than or equal to $mP_T/t_T$ where $P_T$ is the total number of sample locations in the field of view, $t_T$ is total time available to measure all of the sample locations (in some instances, $t_T$ is the inverse of the required field of view update rate), and m is the time needed to take the measurement of a single sample location. When the field of view has the sample locations arranged in two or more sets of parallel or substantially parallel lines where each sample location is included in one line from the first set of parallel lines and also in one line from the second set of parallel lines N is greater than or equal to $P_{d1}/n_c$ where $n_c$ is less than or equal to $(t_7/m*P_{d2})$. $P_{d1}$ is the number of lines in a first set of parallel lines. $P_{d2}$ is the number of lines in a first set of parallel lines. The symbol $n_c$ is a positive integer that is greater than zero. The symbol N represents a positive integer that is greater than zero and less than the higher of $P_{d1}$ or $P_{d2}$.

DESCRIPTION

Figure 1:
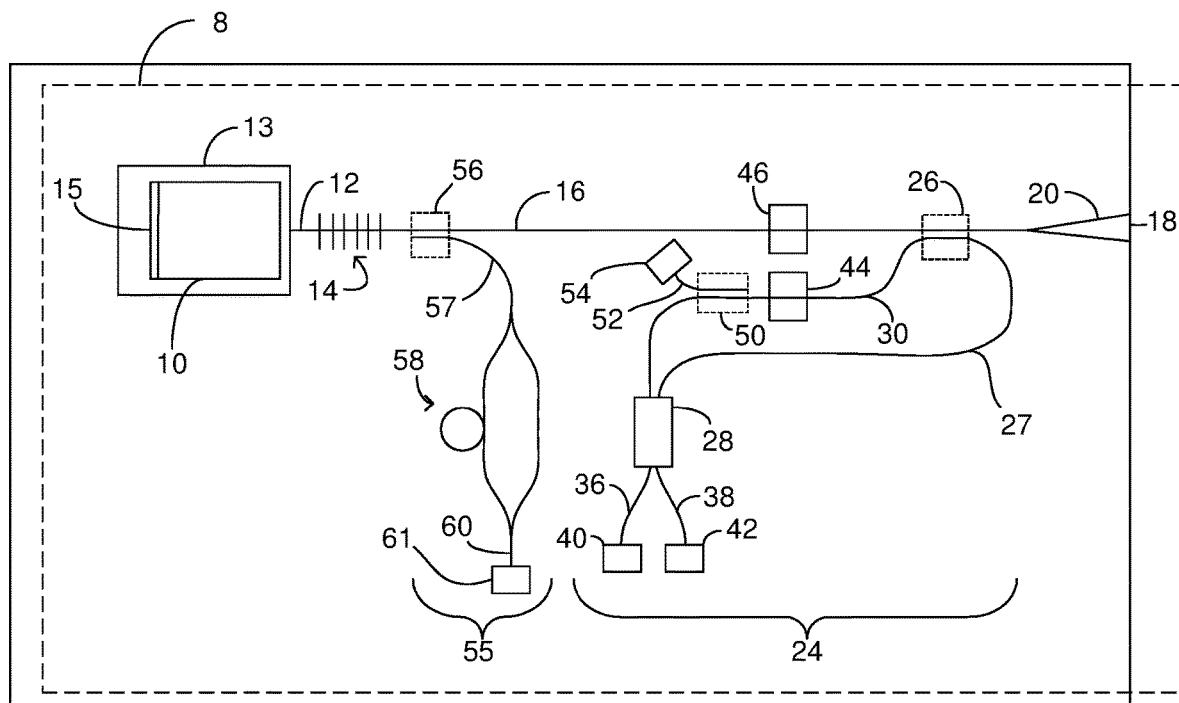
FIG. 1 is a top view of a LIDAR chip.

A LIDAR system includes multiple component assemblies that are each configured to generate a LIDAR output signal. The LIDAR system is also configured to steer each of the LIDAR output signal to a different sample location in a field of view. The LIDAR system is configured to generate LIDAR data for each of the sample locations. The number of LIDAR output signals generated by the system is selected to satisfy the sampling rate required by the LIDAR application. Additionally, the LIDAR output signals generated by different components assemblies have different wavelengths to permit concurrent use of the different LIDAR output signals.

The mechanism used to steer the LIAR output signals can be a solid-state mechanism. For instance, the LIDAR chip can include multiple steering waveguides that each carries an output signal. The steering waveguides each terminate at a facet. The facets are arranged such that the output signals exit the steering waveguides through the facets and combine to form the LIDAR output signal. Phase tuners are positioned on at least a portion of the steering waveguides. Electronics operate the phase tuners so as to tune a phase differential between the output signals on adjacent steering waveguides. The electronics tune the phase differential so as to tune the direction that the LIDAR output signal travels away from the chip.

The waveguide constructions that are generally used with LIDAR chips constructed from SOI-type platforms can make these chips difficult to apply to LIDAR applications. Accurate forming and steering of the LIDAR output signals depends on maintaining a constant phase relationship between the various elements of the steering waveguide array. This phase relationship is difficult to maintain with the current waveguide construction because fabrication limitations cause large variations in waveguide width. These variations in waveguide width cause large variations in the effective indexes of refraction of different waveguides. These variations in effective index are a source of phase error and phase noise. One symptom of these phase errors is the presence of side lobes in the LIDAR output signals generated using steering waveguides with small dimensions. As a result, some form of phase correction needs to be employed to ensure correct operation. The inventors have found that increasing the waveguide dimensions to or above 1 μm while maintaining a single-mode configuration reduces these phase errors.

The change in the effective index of refraction/unit width of a steering waveguide is a strong function of waveguide dimensions at heights below 1 μm but that this functionality suddenly drops to at or near 0.0 at diameters above 1 μm. Since changes to the effective index of refraction affect signal phase, increasing the diameter or width and height of 1 μm reduces the amount of phase loss due to changes in the effective index of refraction. Further, the propagation loss of the signals through the steering waveguides drops dramatically as the diameter or width and height of increases above 1 μm. In view of these results, effective phase-based steering can be achieved by constructing the steering waveguides such that the ridge has a diameter or height and width greater than 1 μm and less than 4 μm. In some instances, the steering waveguides are constructed such that the waveguide has a diameter or height and width greater than 1 μm and less than 4 μm and extends away from slab regions with a thickness greater than 0.0 μm and less than 3 μm. Steering waveguides with these dimensions show a surprising reduction in the presence of sidelobes in the LIDAR output signal. Accordingly, the use of these dimensions reduces phase noise to a level that makes the use of steering waveguides both possible and practical.

Additionally, the common waveguide typically has the same dimensions as the steering waveguides due to fabrication limitations. For instance, at least the height of the steering waveguides is typically the same as the height of the steering waveguides due to the difficulty of vertically tapering large numbers steering waveguides. Since the common light signal includes the power from the output light signals combined in a single signal, the common waveguide carries light at higher power levels than each of the steering waveguides. For instance, the common waveguide carries the common light signal at a power level P while the steering waveguides will typically carry power levels of approximately P/N where N is the number of steering waveguides. However, the effects of self-phase modulation, cross phase modulation, stimulated Raman scattering and two photon absorption in waveguides each begin to affect waveguide performance as the power being carried by a waveguide increases above certain power thresholds. As the dimensions of the waveguide increase, the power thresholds increase. Once the waveguide dimensions increase above a diameter or width and height of 1 μm, the power threshold of the waveguides increases to above 1 W. For many LIDAR applications, it is desirable to increase the power of the LIDAR output signals to levels at or above 1 W. For instance, in LIDAR applications such as autonomous vehicles the LIDAR output signals have a power levels at or above 1 W. Accordingly, these waveguide dimensions allow the common waveguide to carry signals with power levels at or above 1 W without substantial effects from self-phase modulation, cross phase modulation, stimulated Raman scattering and two photon absorption.

FIG. 1 is a topview of a LIDAR chip that includes a laser cavity. The laser cavity includes a light source 10 that can include or consist of a gain medium (not shown) for a laser. The chip also includes a cavity waveguide 12 that receives a light signal from the light source 10. The light source can be positioned in a recess 13 so a facet of the light source is optically aligned with a facet of the cavity waveguide 12 to allow the light source and cavity waveguide 12 to exchange light signals. The cavity waveguide 12 carries the light signal to a partial return device 14. The illustrated partial return device 14 is an optical grating such as a Bragg grating. However, other partial return devices 14 can be used; for instance, mirrors can be used in conjunction with echelle gratings and arrayed waveguide gratings.

The partial return device 14 returns a return portion of the light signal to the cavity waveguide 12 as a return signal. For instance, the cavity waveguide 12 returns the return signal to the light source 10 such that the return portion of the light signal travels through the gain medium. The light source 10 is configured such that at least a portion of the return signal is added to the light signal that is received at the cavity waveguide 12. For instance, the light source 10 can include a highly, fully, or partially reflective device 15 that reflects the return signal received from the gain medium back into the gain medium. As a result, light can resonate between the partial return device 14 and the reflective device 15 so as to form a Distributed Bragg Reflector (DBR) laser cavity. A DBR laser cavity has an inherently narrow-linewidth and a longer coherence length than DFB lasers and accordingly improves performance when an object reflecting the LIDAR output signal from the chip is located further away from the chip.

The partial return device 14 passes a portion of the light signal received from the cavity waveguide 12 to a utility waveguide 16 included on the chip. The portion of the light signal that the utility waveguide 16 receives from the partial return device 14 serves as the output of the laser cavity. The output of the laser cavity serves as an outgoing LIDAR signal on the utility waveguide 16. The utility waveguide 16 terminates at a facet 18 and carries the outgoing LIDAR signal to the facet 18. The facet 18 can be positioned such that the outgoing LIDAR signal traveling through the facet 18 exits the chip and serves as a LIDAR output signal. For instance, the facet 18 can be positioned at an edge of the chip so the outgoing LIDAR signal traveling through the facet 18 exits the chip and serves as a LIDAR output signal.

The LIDAR output signal travels away from the chip and is reflected by objects in the path of the LIDAR signal. The reflected signal travels away from the objects. At least a portion of the reflected signal returns to the facet 18 of the utility waveguide 16. Accordingly, a portion of the reflected signal can enter the utility waveguide 16 through the facet 18 and serve as a LIDAR input signal guided by the utility waveguide 16.

The utility waveguide 16 can include a tapered portion before the facet 18. For instance, the utility waveguide 16 can include a taper 20 that terminate at the facet 18. The taper 20 can relax the alignment tolerances required for efficient coupling of the utility waveguide 16 to the LIDAR input light and the outgoing LIDAR signal. Accordingly, the taper 20 can increase the percentage of the LIDAR input signal that is successfully returned to the chip for processing. In some instances, the taper 20 is constructed such that the facet 18 has an area that is more than two, five, or ten times the area of a cross section of a straight portion of the utility waveguide 16. Although FIG. 1 shows the taper 20 as a horizontal taper, the taper 20 can be a horizontal and/or vertical taper. The horizontal and/or vertical taper can be linear and/or curved. In some instances, the taper 20 is an adiabatic taper.

The chip includes a data branch 24 where the optical signals that carry the LIDAR data are generated. The data branch includes an optical coupler 26 that moves a portion of the light signals from the utility waveguide 16 into the data branch. For instance, an optical coupler 26 couples a portion of the outgoing LIDAR signal from the utility waveguide 16 onto a reference waveguide 27 as a reference signal. The reference waveguide 27 carries the reference signal to a light-combining component 28.

The optical coupler 26 also couples a portion of the LIDAR input signal from the utility waveguide 16 onto a comparative waveguide 30 as a comparative signal. The comparative signal includes at least a portion of the light from the LIDAR input signal. The comparative signal can exclude light from the reference light signal. The comparative waveguide 30 carries the comparative signal to the light-combining component 28.

The illustrated optical coupler 26 is a result of positioning the utility waveguide 16 sufficiently close to the reference waveguide 27 and the comparative waveguide 30 that light from the utility waveguide 16 is coupled into the reference waveguide 27 and the comparative waveguide 30; however, other signal tapping components can be used to move a portion of the of the light signals from the utility waveguide 16 onto the reference waveguide 27 and the comparative waveguide 30. Examples of suitable signal tapping components include, but are not limited to, y-junctions, multi-mode interference couplers (MMIs), and integrated optical circulators.

The light-combining component 28 combines the comparative signal and the reference signal into a composite signal. The reference signal includes light from the outgoing LIDAR signal. For instance, the reference signal can serve as a sample of the outgoing LIDAR signal. The reference signal can exclude light from the LIDAR output signal and the LIDAR input signal. In contrast, the comparative signal light includes light from the LIDAR input signal. For instance, the comparative signal can serve as a sample of the LIDAR input signal. Accordingly, the comparative signal has been reflected by an object located off of the chip while the LIDAR output signal has not been reflected. When the chip and the reflecting object are moving relative to one another, the comparative signal and the reference signal have different frequencies due to the Doppler effect. As a result, beating occurs between the comparative signal and the reference signal.

The light-combining component 28 also splits the resulting composite sample signal onto a first detector waveguide 36 and a second detector waveguide 38. The first detector waveguide 36 carries a first portion of the composite sample signal to a first light sensor 40 that converts the first portion of the composite sample signal to a first electrical signal. The second detector waveguide 38 carries a second portion of the composite sample signal to a second light sensor 42 that converts the second portion of the composite sample signal to a second electrical signal. Examples of suitable light sensors include germanium photodiodes (PDs), and avalanche photodiodes (APDs).

The light combining component 28, the first light sensor 40 and the second light sensor 42 can be connected as a balanced photodetector that outputs an electrical data signal. For instance, the light combining component 28, the first light sensor 40 and the second light sensor 42 can be connected such that the DC components of the signal photocurrents cancel, improving detection sensitivity. Suitable methods for connecting the first light sensor 40 and the second light sensor 42 as balanced photodetectors includes connecting the first light sensor 40 and the second light sensor 42 in series. In one example, the first light sensor 40 and the second light sensor 42 are both avalanche photodiodes connected in series. Balanced photodetection is desirable for detection of small signal fluctuations.

An example of a suitable light-combining component 28 is a Multi-Mode Interference (MMI) device such as a 2×2 MMI device. Other suitable light-combining components 28 include, but are not limited to, adiabatic splitters, and directional coupler. In some instances, the functions of the illustrated light-combining component 28 are performed by more than one optical component or a combination of optical components.

A single light sensor can replace the first light sensor 40 and the second light sensor 42 and can output the data signal. When a single light sensor replaces the first light sensor 40 and the second light sensor 42, the light-combining component 28 need not include light-splitting functionality. As a result, the illustrated light light-combining component 28 can be a 2×1 light-combining component rather than the illustrated 2×1 light-combining component. For instance, the illustrated light light-combining component can be a 2×1 MMI device. In these instances, the chip includes a single detector waveguide that carries the composite sample signal to the light sensor.

The data branch includes a data optical attenuator 44 positioned along the comparative waveguide 30 such that the data optical attenuator 44 can be operated so as to attenuate the comparative signal on the comparative waveguide 30. The chip also includes an output optical attenuator 46 positioned along the utility waveguide 16 such that the output optical attenuator 46 can be operated so as to attenuate the outgoing LIDAR signal on the utility waveguide 16. Suitable attenuators for the data optical attenuator 44 and/or the output optical attenuator 46 are configured to attenuate intensity of a light signal. Examples of a suitable attenuator configured to attenuate intensity of a light signal include carrier-injection based PIN diodes, electro-absorption modulators, and Mach-Zehnder (MZ) modulators.

The chip also includes a sampling directional coupler 50 that couples a portion of the comparative signal from the comparative waveguide 30 onto a sampling waveguide 52. The coupled portion of the comparative signal serves as a sampling signal. The sampling waveguide 52 carries the sampling signal to a sampling light sensor 54. Although FIG. 1 illustrates a sampling directional coupler 50 moving a portion of the comparative signal onto the sampling waveguide 52, other signal tapping components can be used to move a portion of the comparative signal from the comparative waveguide 30 onto the sampling waveguide 52. Examples of suitable signal tapping components include, but are not limited to, y-junctions, and MMIs.

The chip includes a control branch 55 for controlling operation of the laser cavity. The control branch includes a directional coupler 56 that moves a portion of the outgoing LIDAR signal from the utility waveguide 16 onto a control waveguide 57. The coupled portion of the outgoing LIDAR signal serves as a tapped signal. Although FIG. 1 illustrates a directional coupler 56 moving portion of the outgoing LIDAR signal onto the control waveguide 57, other signal-tapping components can be used to move a portion of the outgoing LIDAR signal from the utility waveguide 16 onto the control waveguide 57. Examples of suitable signal tapping components include, but are not limited to, y-junctions, and MMIs.

The control waveguide 57 carries the tapped signal to an interferometer 58 that splits the tapped signal and then re-combines the different portions of the tapped signal with a phase differential between the portions of the tapped signal. The illustrated interferometer 58 is a Mach-Zehnder interferometer; however, other interferometers can be used.

The interferometer 58 outputs a control light signal on an interferometer waveguide 60. The interferometer waveguide 60 carries the control light signal to a control light sensor 61 that converts the control light signal to an electrical signal that serves as an electrical control signal. The interferometer signal has an intensity that is a function of the frequency and/or change in frequency of the outgoing LIDAR signal. For instance, a Mach-Zehnder interferometer will output a sinusoidal control light signal with a fringe pattern. Changes to the frequency of the outgoing lidar signal will cause changes to the frequency of the control light signal. Accordingly, the frequency of the electrical control signal output from the control light sensor 61 is a function of the frequency of the outgoing lidar signal. Other detection mechanisms can be used in place of the control light sensor 61. For instance, the control light sensor 61 can be replaced with a balanced photodetector arranged as the light combining component 28, the first light sensor 40 and the second light sensor 42.

Electronics 62 can operate one or more components on the chip. For instance, the electronics 62 can be in electrical communication with and control operation of the light source 10, the data optical attenuator 44, output optical attenuator 46, the first light sensor 40, the second light sensor 42, the sampling light sensor 54, and the control light sensor 61. Although the electronics 62 are shown off the chip, all or a portion of the electronics can be included on the chip. For instance, the chip can include electrical conductors that connect the first light sensor 40 in series with the second light sensor 42.

During operation of the chip, the electronics 62 operate the light source 10 such that the laser cavity outputs the outgoing LIDAR signal. The electronics 62 then operate the chip through a series of cycles where each cycle generates at least a distance data point. During each cycle, the data signal is sampled multiple times. During each of the samples, the electronics tune the frequency of the outgoing LIDAR signal. As will be described in more detail below, the electronics can employ output from the control branch in order to control the frequency of the outgoing LIDAR signal such that the frequency of the outgoing LIDAR signal as a function of time is known to the electronics. In some instance, a cycle includes a first sample and a second sample. During the first sample, the electronics 62 can increase the frequency of the outgoing LIDAR signal and during a second sample the electronics 62 can decrease the frequency of the outgoing LIDAR signal. For instance, the laser cavity can be configured to output an outgoing LIDAR signal (and accordingly a LIDAR output signal) with a wavelength of 1550 nm. During the first sample, the electronics 62 can increase the frequency of the outgoing LIDAR signal (and accordingly a LIDAR output signal) such that the wavelength decreases from 1550 nm to 1459.98 nm followed by decreasing the frequency of the outgoing LIDAR signal such that the wavelength increases from 1459.98 nm to 1550 nm.

When the outgoing LIDAR signal frequency is increased during the first sample, the LIDAR output signal travels away from the chip and then returns to the chip as a LIDAR input signal. A portion of the LIDAR input signal becomes the comparative signal. During the time that the LIDAR output signal and the LIDAR input signal are traveling between the chip and a reflecting object, the frequency of the outgoing LIDAR signal continues to increase. Since a portion of the outgoing LIDAR signal becomes the reference signal, the frequency of the reference signal continues to increase. As a result, the comparative signal enters the light-combining component with a lower frequency than the reference signal concurrently entering the light-combining component. Additionally, the further the reflecting object is located from the chip, the more the frequency of the reference signal increases before the LIDAR input signal returns to the chip. Accordingly, the larger the difference between the frequency of the comparative signal and the frequency of the reference signal, the further the reflecting object is from the chip. As a result, the difference between the frequency of the comparative signal and the frequency of the reference signal is a function of the distance between the chip and the reflecting object.

For the same reasons, when the outgoing LIDAR signal frequency is decreased during the second sample, the comparative signal enters the light-combining component with a higher frequency than the reference signal concurrently entering the light-combining component and the difference between the frequency of the comparative signal and the frequency of the reference signal during the second sample is also function of the distance between the chip and the reflecting object.

In some instances, the difference between the frequency of the comparative signal and the frequency of the reference signal can also be a function of the Doppler effect because relative movement of the chip and reflecting object can also affect the frequency of the comparative signal. For instance, when the chip is moving toward or away from the reflecting object and/or the reflecting object is moving toward or away from the chip, the Doppler effect can affect the frequency of the comparative signal. Since the frequency of the comparative signal is a function of the speed the reflecting object is moving toward or away from the chip and/or the speed the chip is moving toward or away from the reflecting object, the difference between the frequency of the comparative signal and the frequency of the reference signal is also a function of the speed the reflecting object is moving toward or away from the chip and/or the speed the chip is moving toward or away from the reflecting object. Accordingly, the difference between the frequency of the comparative signal and the frequency of the reference signal is a function of the distance between the chip and the reflecting object and is also a function of the Doppler effect.

The composite sample signal and the data signal each effectively compares the comparative signal and the reference signal. For instance, since the light-combining component combines the comparative signal and the reference signal and these signals have different frequencies, there is beating between the comparative signal and reference signal. Accordingly, the composite sample signal and the data signal have a beat frequency related to the frequency difference between the comparative signal and the reference signal and the beat frequency can be used to determine the difference in the frequency of the comparative signal and the reference signal. A higher beat frequency for the composite sample signal and/or the data signal indicates a higher differential between the frequencies of the comparative signal and the reference signal. As a result, the beat frequency of the data signal is a function of the distance between the chip and the reflecting object and is also a function of the Doppler effect.

As noted above, the beat frequency is a function of two unknowns; the distance between the chip and the reflecting object and the relative velocity of the chip and the reflecting object (i.e., the contribution of the Doppler effect). The change in the frequency difference between the comparative signal and the reference signal ($\Delta f$) is given by $\Delta f = 2\Delta v f/c$ where f is the frequency of the LIDAR output signal and accordingly the reference signal, $\Delta v$ is the relative velocity of the chip and the reflecting object and c is the speed of light in air. The use of multiple different samples permits the electronics 62 to resolve the two unknowns. For instance, the beat frequency determined for the first sample is related to the unknown distance and Doppler contribution and the beat frequency determined for the second sample is also related to the unknown distance and Doppler contribution. The availability of the two relationships allows the electronics 62 to resolve the two unknowns. Accordingly, the distance between the chip and the reflecting object can be determined without influence from the Doppler effect. Further, in some instances, the electronics 62 use this distance in combination with the Doppler effect to determine the velocity of the reflecting object toward or away from the chip.

In instances where the relative velocity of target and source is zero or very small, the contribution of the Doppler effect to the beat frequency is essentially zero. In these instances, the Doppler effect does not make a substantial contribution to the beat frequency and the electronics 62 can take only the first sample to determine the distance between the chip and the reflecting object.

During operation, the electronics 62 can adjust the frequency of the outgoing LIDAR signal in response to the electrical control signal output from the control light sensor 61. As noted above, the magnitude of the electrical control signal output from the control light sensor 61 is a function of the frequency of the outgoing LIDAR signal. Accordingly, the electronics 62 can adjust the frequency of the outgoing LIDAR signal in response to the magnitude of the control. For instance, while changing the frequency of the outgoing LIDAR signal during one of the samples, the electronics 62 can have a range of suitable values for the electrical control signal magnitude as a function of time. At multiple different times during a sample, the electronics 62 can compare the electrical control signal magnitude to the range of values associated with the current time in the sample. If the electrical control signal magnitude indicates that the frequency of the outgoing LIDAR signal is outside the associated range of electrical control signal magnitudes, the electronics 62 can operate the light source 10 so as to change the frequency of the outgoing LIDAR signal so it falls within the associated range. If the electrical control signal magnitude indicates that the frequency of the outgoing LIDAR signal is within the associated range of electrical control signal magnitudes, the electronics 62 do not change the frequency of the outgoing LIDAR signal.

During operation, the electronics 62 can adjust the level of attenuation provided by the output optical attenuator 46 in response to the sampling signal from the sampling light sensor 54. For instance, the electronics 62 operate the output optical attenuator 46 so as to increase the level of attenuation in response to the magnitude of the sampling signal being above a first signal threshold and/or decrease the magnitude of the power drop in response to the magnitude of the sampling signal being below a second signal threshold.

In some instances, the electronics 62 adjust the level of attenuation provided by the output optical attenuator 46 to prevent or reduce the effects of back-reflection on the performance of the laser cavity. For instance, the first signal threshold and/or the second signal threshold can optionally be selected to prevent or reduce the effects of back-reflection on the performance of the laser cavity. Back reflection occurs when a portion of the LIDAR input signal returns to the laser cavity as a returned LIDAR signal. In some instances, on the order of 50% of the LIDAR input signal that passes through the facet 18 returns to the laser cavity. The returned LIDAR signal can affect performance of the laser cavity when the power of the returned LIDAR signal entering the partial return device 14 does not decrease below the power of the outgoing LIDAR signal exiting from the partial return device 14 ("power drop") by more than a minimum power drop threshold. In the illustrated chip, the minimum power drop threshold can be around 35 dB (0.03%). Accordingly, the returned lidar signal can affect the performance of the laser cavity when the power of the returned LIDAR signal entering the partial return device 14 is not more than 35 dB below the power of the outgoing LIDAR signal exiting from the partial return device 14.

The electronics 62 can operate the output optical attenuator 46 so as to reduce the effect of low power drops, e.g. when the target object is very close or highly reflective or both. As is evident from FIG. 1, operation of the output optical attenuator 46 so as to increase the level of attenuation reduces the power of the returned LIDAR signal entering the partial return device 14 and also reduces the power of the returned outgoing LIDAR signal at a location away from the partial return device 14. Since the output optical attenuator 46 is located apart from the partial return device 14, the power of the outgoing LIDAR signal exiting from the partial return device 14 is not directly affected by the operation of the output optical attenuator 46. Accordingly, the operation of the output optical attenuator 46 so as to increase the level of attenuation increases the level of the power drop. As a result, the electronics can employ the optical attenuator 46 so as to tune the power drop.

Additionally, the magnitude of the sampling signal is related to the power drop. For instance, the magnitude of the sampling signal is related to the power of the comparative signal as is evident from FIG. 1. Since the comparative signal is a portion of the lidar input signal, the magnitude of the sampling signal is related to the power of the lidar input signal. This result means the magnitude of the sampling signal is also related to the power of the returned LIDAR signal because the returned LIDAR signal is a portion of the lidar input signal. Accordingly, the magnitude of the sampling signal is related to the power drop.

Since the magnitude of the sampling signal is related to the power drop, the electronics 62 can use the magnitude of the sampling signal to operate the output optical attenuator so as to keep the magnitude of the comparative signal power within a target range. For instance, the electronics 62 can operate the output optical attenuator 46 so as to increase the magnitude of the power drop in response to the sampling signal indicating that the magnitude of power drop is at or below a first threshold and/or the electronics 62 can operate the output optical attenuator 46 so as to decrease the magnitude of the power drop in response to the sampling signal indicating that the magnitude of power drop is at or above a second threshold. In some instances, the first threshold is greater than or equal to the minimum power drop threshold. In one example, the electronics 62 operate the output optical attenuator 46 so as to increase the magnitude of the power drop in response to the magnitude of the sampling signal being above a first signal threshold and/or decrease the magnitude of the power drop in response to the magnitude of the sampling signal being below a second signal threshold. The identification of the value(s) for one, two, three, or four variables selected from the group consisting of the first threshold, the second threshold, the first signal threshold, and the second signal threshold can be determined from calibration of the optical chip during set-up of the LIDAR chip system.

Light sensors can become saturated when the power of the composite light signal exceeds a power threshold. When a light sensor becomes saturated, the magnitude of the data signal hits a maximum value that does not increase despite additional increases in the power of the composite light signal above the power threshold. Accordingly, data can be lost when the power of the composite light signal exceeds a power threshold. During operation, the electronics 62 can adjust the level of attenuation provided by the data optical attenuator 44 so the power of the composite light signal is maintained below a power threshold.

As is evident from FIG. 1, the magnitude of the sampling signal is related to the power of the comparative signal. Accordingly, the electronics 62 can operate the data optical attenuator 44 in response to output from the sampling signal. For instance, the electronics 62 can operate the data optical attenuator so as to increase attenuation of the comparative signal when the magnitude of the sampling signal indicates the power of the comparative signal is above an upper comparative signal threshold and/or can operate the data optical attenuator so as to decrease attenuation of the comparative signal when the magnitude of the sampling signal indicates the power of the comparative signal is below a lower comparative signal threshold. For instance, in some instances, the electronics 62 can increase attenuation of the comparative signal when the magnitude of the sampling signal is at or above an upper comparative threshold and/or the electronics 62 decrease attenuation of the comparative signal when the magnitude of the sampling signal is at or below an upper comparative signal threshold.

Figure 2:
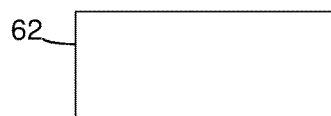
FIG. 2 is a cross-section of a LIDAR chip according to FIG. 1 constructed from a silicon-on-insulator wafer.
Figure 2:
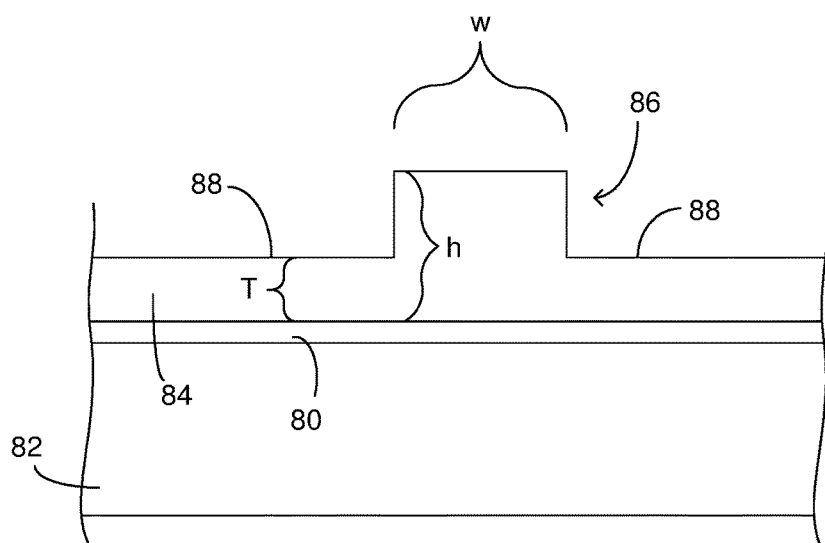

As noted above, the electronics 62 can adjust the level of attenuation provided by the output optical attenuator 46 in response to the sampling signal. The electronics 62 can adjust the level of attenuation provided by the data optical attenuator 44 in response to the sampling signal in addition or as an alternative to adjusting the level of attenuation provided by the output optical attenuator 46 in response to the sampling signal Suitable platforms for the chip include, but are not limited to, silica, indium phosphide, and silicon-on-insulator wafers. FIG. 2 is a cross-section of portion of a chip constructed from a silicon-on-insulator wafer. A silicon-on-insulator (SOI) wafer includes a buried layer 80 between a substrate 82 and a light-transmitting medium 84. In a silicon-on-insulator wafer, the buried layer is silica while the substrate and the light-transmitting medium are silicon. The substrate of an optical platform such as an SOI wafer can serve as the base for the entire chip. For instance, the optical components shown in FIG. 1 can be positioned on or over the top and/or lateral sides of the substrate.

The portion of the chip illustrated in FIG. 2 includes a waveguide construction that is suitable for use with chips constructed from silicon-on-insulator wafers. A ridge 86 of the light-transmitting medium extends away from slab regions 88 of the light-transmitting medium. The light signals are constrained between the top of the ridge and the buried oxide layer.

The dimensions of the ridge waveguide are labeled in FIG. 2. For instance, the ridge has a width labeled w and a height labeled h. A thickness of the slab regions is labeled T. For LIDAR applications, these dimensions are more important than other applications because of the need to use higher levels of optical power than are used in other applications. The ridge width (labeled w) is greater than 1 µm and less than 4 µm, the ridge height (labeled h) is greater than 1 µm and less than 4 µm, the slab region thickness is greater than 0.5 µm and less than 3 µm. These dimensions can apply to straight or substantially straight portions of the waveguide, curved portions of the waveguide and tapered portions of the waveguide(s). Accordingly, these portions of the waveguide will be single mode. However, in some instances, these dimensions apply to straight or substantially straight portions of a waveguide while curved portions of the waveguide and/or tapered portions of the waveguide have dimensions outside of these ranges. For instance, the tapered portions of the utility waveguide 16 illustrated in FIG. 1 can have a width and/or height that is >4 µm and can be in a range of 4 µm to 12 µm. Additionally or alternately, curved portions of a waveguide can have a reduced slab thickness in order to reduce optical loss in the curved portions of the waveguide. For instance, a curved portion of a waveguide can have a ridge that extends away from a slab region with a thickness greater than or equal to 0.0 µm and less than 0.5 µm. While the above dimensions will generally provide the straight or substantially straight portions of a waveguide with a single-mode construction, they can result in the tapered section(s) and/or curved section(s) that are multi-mode. Coupling between the multi-mode geometry to the single mode geometry can be done using tapers that do not substantially excite the higher order modes. Accordingly, the waveguides can be constructed such that the signals carried in the waveguides are carried in a single mode even when carried in waveguide sections having multi-mode dimensions. The waveguide construction of FIG. 2 is suitable for all or a portion of the waveguides selected from the group consisting of the cavity waveguide 12, utility waveguide 16, reference waveguide 27, comparative waveguide 30, first detector waveguide 36, second detector waveguide 38, sampling waveguide 52, control waveguide 57, and interferometer waveguide 60. The waveguide construction disclosed in the context of FIG. 2 is also suitable for steering waveguides that will be disclosed below.

The light source 10 that is interfaced with the utility waveguide 16 can be a gain element that is a component separate from the chip and then attached to the chip. For instance, the light source 10 can be a gain element that is attached to the chip using a flip-chip arrangement.

Use of flip-chip arrangements is suitable when the light source 10 is to be interfaced with a ridge waveguide on a chip constructed from silicon-on-insulator wafer. Examples of suitable interfaces between flip-chip gain elements and ridge waveguides on chips constructed from silicon-on-insulator wafer can be found in U.S. Pat. No. 9,705,278, issued on Jul. 11, 2017 and in U.S. Pat. No. 5,991,484 issued on Nov. 23, 1999; each of which is incorporated herein in its entirety. The constructions are suitable for use as the light source 10. When the light source 10 is a gain element, the electronics 62 can change the frequency of the outgoing LIDAR signal by changing the level of electrical current applied to through the gain element.

The attenuators can be a component that is separate from the chip and then attached to the chip. For instance, the attenuator can be included on an attenuator chip that is attached to the chip in a flip-chip arrangement. The use of attenuator chips is suitable for all or a portion of the attenuators selected from the group consisting of the data attenuator and the control attenuator.

As an alternative to including an attenuator on a separate component, all or a portion of the attenuators can be integrated with the chip. For instance, examples of attenuators that are interfaced with ridge waveguides on a chip constructed from a silicon-on-insulator wafer can be found in U.S. Pat. No. 5,908,305, issued on Jun. 1, 1999; each of which is incorporated herein in its entirety. The use of attenuators that are integrated with the chip are suitable for all or a portion of the light sensors selected from the group consisting of the data attenuator and the control attenuator.

Light sensors that are interfaced with waveguides on a chip can be a component that is separate from the chip and then attached to the chip. For instance, the light sensor can be a photodiode, or an avalanche photodiode. Examples of suitable light sensor components include, but are not limited to, InGaAs PIN photodiodes manufactured by Hamamatsu located in Hamamatsu City, Japan, or an InGaAs APD (Avalanche Photo Diode) manufactured by Hamamatsu located in Hamamatsu City, Japan. These light sensors can be centrally located on the chip as illustrated in FIG. 1. Alternately, all or a portion the waveguides that terminate at a light sensor can terminate at a facet 18 located at an edge of the chip and the light sensor can be attached to the edge of the chip over the facet 18 such that the light sensor receives light that passes through the facet 18. The use of light sensors that are a separate component from the chip is suitable for all or a portion of the light sensors selected from the group consisting of the first light sensor 40, the second light sensor 42, the sampling light sensor 54, and the control light sensor 61.

As an alternative to a light sensor that is a separate component, all or a portion of the light sensors can be integrated with the chip. For instance, examples of light sensors that are interfaced with ridge waveguides on a chip constructed from a silicon-on-insulator wafer can be found in Optics Express Vol. 15, No. 21, 13965-13971 (2007); U.S. Pat. No. 8,093,080, issued on Jan. 10, 2012; U.S. Pat. No. 8,242,432, issued Aug. 14, 2012; and U.S. Pat. No. 6,108,8472, issued on Aug. 22, 2000 each of which is incorporated herein in its entirety. The use of light sensors that are integrated with the chip are suitable for all or a portion of the light sensors selected from the group consisting of the first light sensor 40, the second light sensor 42, the sampling light sensor 54, and the control light sensor 61.

Construction of optical gratings that are integrated with a variety of optical device platforms are available. For instance, a Bragg grating can be formed in a ridge waveguides by forming grooves in the top of the ridge and/or in the later sides of the ridge.

In some instances, it is desirable to scan the LIDAR output signal. The above chip construction is suitable for use with various scanning mechanisms used in LIDAR applications. For instance, the output LIDAR signal can be received by one or more reflecting devices and/or one more collimating devices. The one or more reflecting devices can be configured to re-direct and/or steer the LIDAR output signal so as to provide scanning of the LIDAR output signal. Suitable reflecting devices include, but are not limited to, mirrors such mechanically driven mirrors and Micro Electro Mechanical System (MEMS) mirrors. The one or more collimating devices provide collimation of the LIDAR output signal and can accordingly increase the portion of the LIDAR input signal that is received in the utility waveguide 16. Suitable collimating devices include, but are not limited to, individual lenses and compound lenses.

Figure 3:
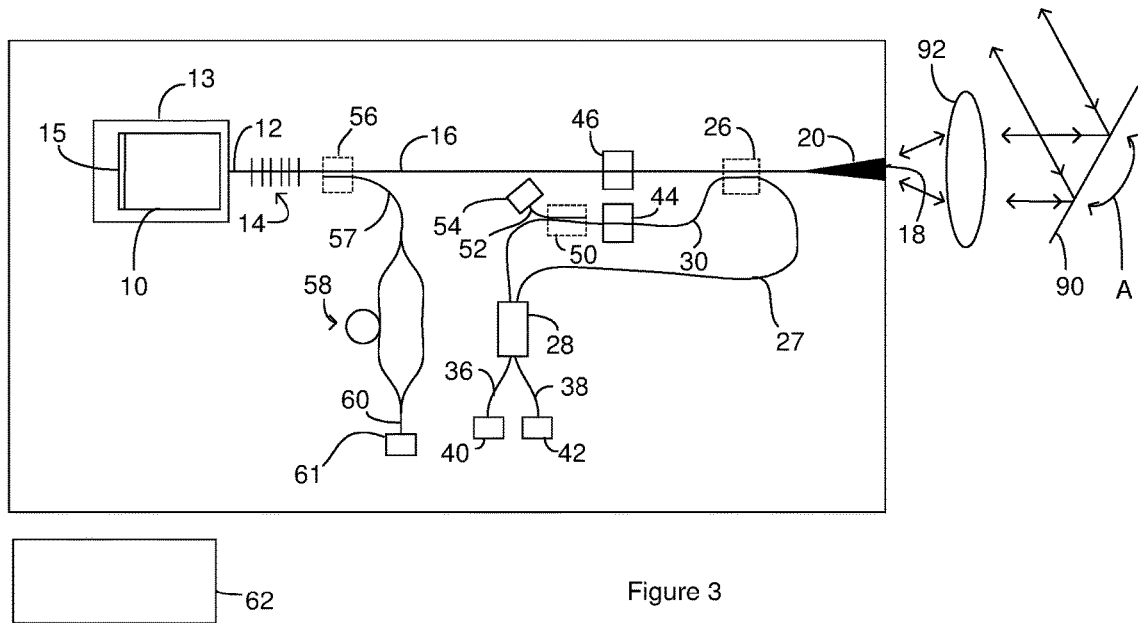
FIG. 3 illustrates the LIDAR chip of FIG. 1 used with an off-chip scanning mechanism.

FIG. 3 illustrates the above chip used with a reflecting device 90 and a collimating device 92. For instance, a lens serves as a collimating device that receives the LIDAR output signal and provides collimation of the LIDAR output signal. A mirror serves as a reflecting device 90 that receives the collimated LIDAR output signal and reflects the collimated LIDAR output signal in the desired direction. As is illustrated by the arrow labeled A, the electronics can move the mirror so as to steer the collimated LIDAR output signal and/or scan the collimated LIDAR output signal. The movement of the mirror can be in one dimension or two dimensions. Suitable mirrors include, but are not limited to, mechanically driven mirrors and Micro Electro Mechanical System (MEMS) mirrors.

Figure 4:
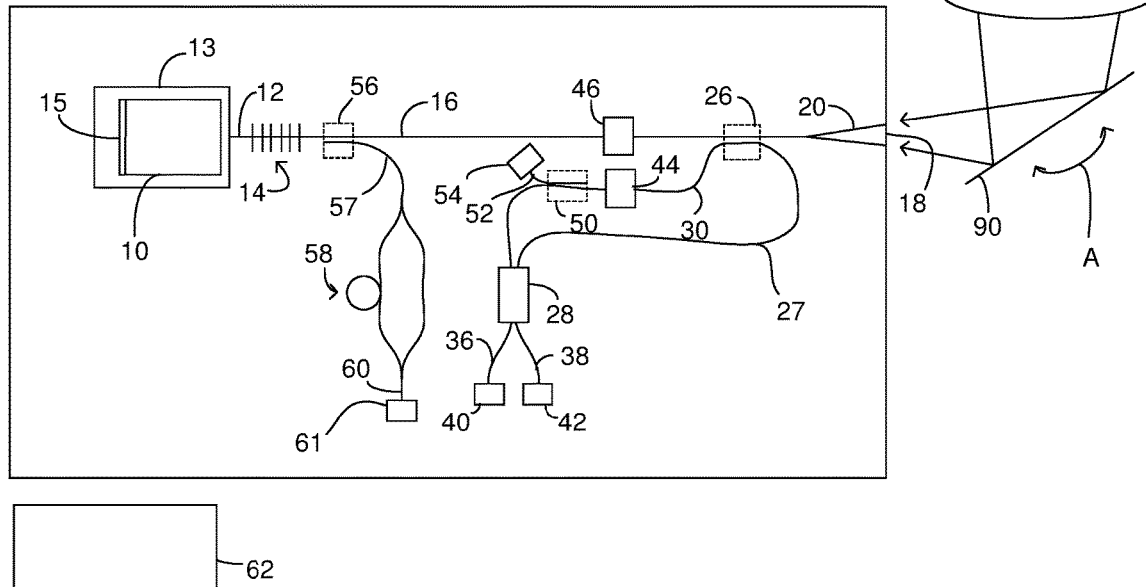
FIG. 4 illustrates the LIDAR chip of FIG. 1 used with another embodiment of an off-chip scanning mechanism.

FIG. 4 illustrates the above chip used with a reflecting device 90 and a collimating device 92. For instance, a mirror serves as a reflecting device 90 that receives the LIDAR output signal and reflects the LIDAR output signal in the desired direction. As is illustrated by the arrow labeled A, the electronics can move the mirror so as to steer the LIDAR output signal and/or scan the LIDAR output signal. A lens serves as a collimating device 92 that receives the LIDAR output signal from the mirror and provides collimation of the LIDAR output signal. The lens can be configured to move with the movement of the mirror so the lens continues to receive the LIDAR output signal at different positions of the mirror. Alternately, the movement of the mirror can be sufficiently limited that the lens continues to receive the LIDAR output signal at different positions of the mirror. The movement of the mirror can be in one or two dimensions. Suitable mirrors include, but are not limited to, mechanically driven mirrors and Micro Electro Mechanical System (MEMS) mirrors.

Figure 5:
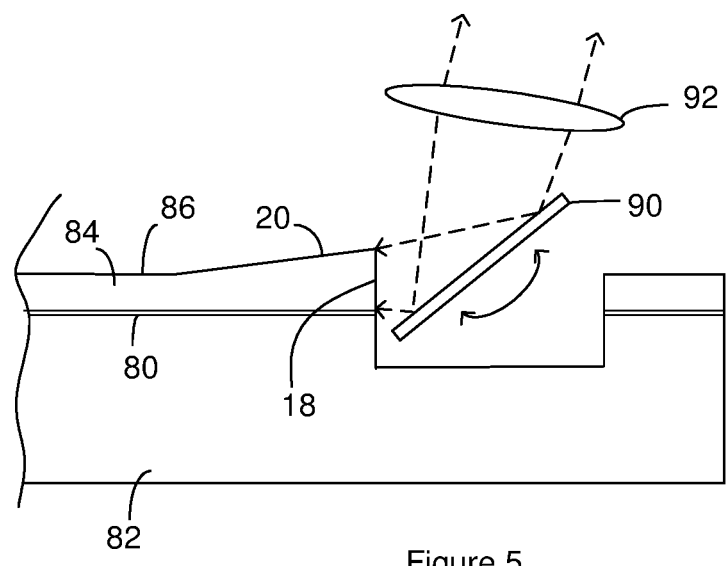
FIG. 5 is a cross section of the LIDAR chip of FIG. 1 having an integrated scanning mechanism.

Technologies such as SOI MEMS (Silicon-On-Insulator Micro Electro Mechanical System) technology can be used to incorporate a reflecting device such as a MEMS mirror into the chip. For instance, FIG. 5 is a cross section of a portion of the chip taken through the longitudinal axis of the utility waveguide 16. The illustrated chip was constructed on silicon-on-insulator waveguide. A mirror recess extends through the light-transmitting medium to the base. The mirror is positioned in the mirror recess such that the mirror receives the LIDAR output signal from the utility waveguide. A lens serves as a collimating device 92 that receives the LIDAR output signal from the mirror and provides collimation of the LIDAR output signal. The lens can be configured to move with the movement of the mirror so the lens continues to receive the LIDAR output signal at different positions of the mirror. Alternately, the movement of the mirror can be sufficiently limited that the lens continues to receive the LIDAR output signal at different positions of the mirror. The electronics can control movement of the mirror in one or two dimensions.

The above chips can include alternative methods of scanning and/or steering the LIDAR output signal in addition to a reflecting device or as an alternative device. For instance, the chip can include a component for spitting the outgoing LIDAR signal into multiple output signals. The chip can then tune the phase difference between different output signals so as to control the direction that the LIDAR output signal travels away from the chip. The LIDAR output signal can be steered or scanned by changing the level of the phase difference between the output signals.

Figure 6:
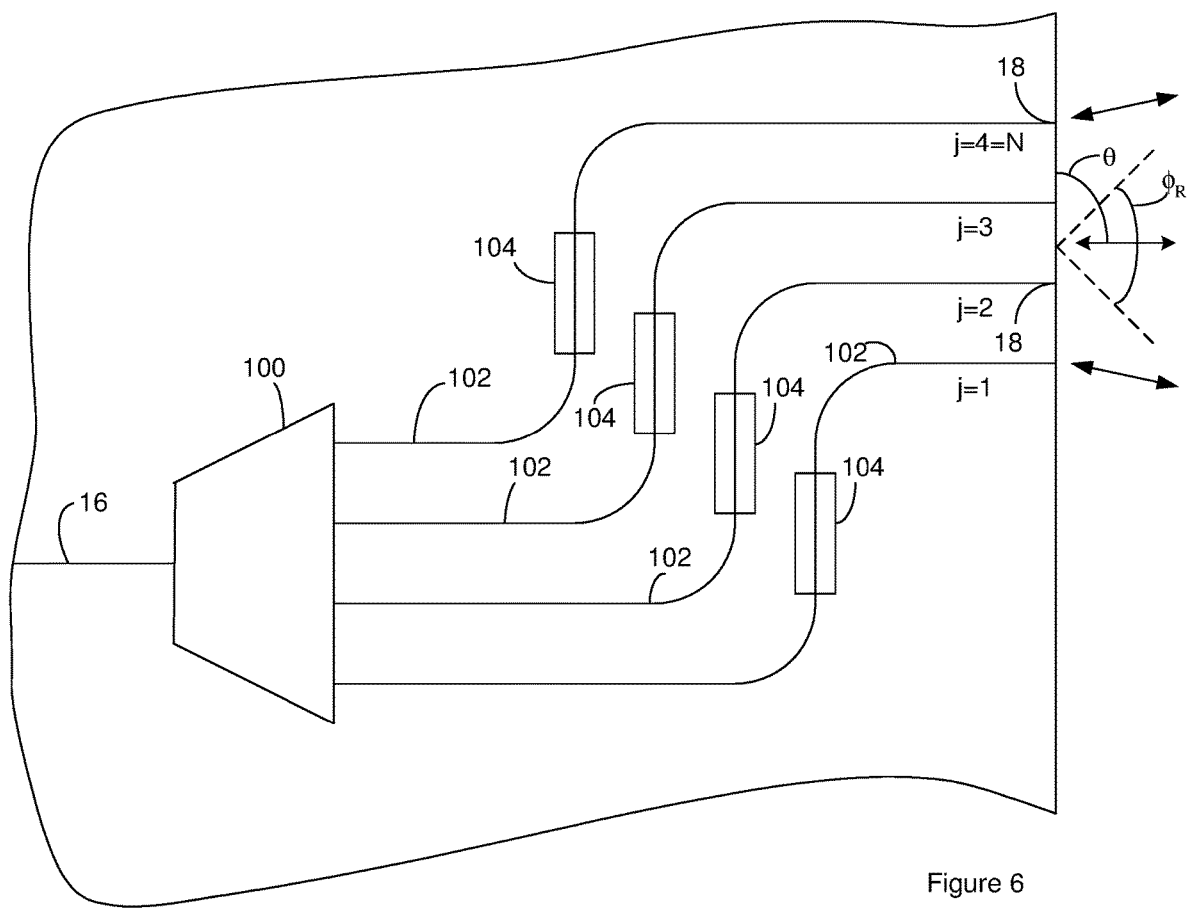
FIG. 6 illustrates a portion of the chip modified so as to use a phase differential between output signals to steer a LIDAR output signal.

FIG. 6 illustrates a portion of a chip configured to use the phase differential between output signals to steer a LIDAR output signal. The portion(s) of the chip that are not illustrated in FIG. 6 can be constructed as described above. For instance, the utility waveguide 16 shown in FIG. 6 can be the utility waveguide 16 of a chip constructed as shown in FIG. 1. As is evident from FIG. 6, the utility waveguide 16 can serve as the common waveguide discussed above. Accordingly, the outgoing LIDAR signal can serve as the common light signal discussed above.

The utility waveguide 16 carries the outgoing LIDAR signal to a splitter 100 that divides the outgoing LIDAR signal into multiple output signals that are each carried on a steering waveguide 102. Each of the steering waveguides 102 ends at a facet 18. The facets 18 are arranged such that the output signals exiting the chip through the facets 18 combine to form the LIDAR output signal.

The splitter 100 and steering waveguides 102 can be constructed such that there is not a phase differential between output signals at the facet 18 of adjacent steering waveguides 102. For instance, the splitter 100 can be constructed such that each of the output signals is in-phase upon exiting from the splitter 100 and the steering waveguides 102 can each have the same length. Alternately, the splitter 100 and steering waveguides 102 can be constructed such that there is a small linearly increasing phase differential between output signals at the facet 18 of adjacent steering waveguides 102. For instance, the steering waveguides 102 can be constructed such that the phase of steering waveguide number j is $f_o+(j-1)f$ where j is an integer from 1 to N and represents the number associated with a steering waveguide when the steering waveguides are sequentially numbered as shown in FIG. 6, f is the phase differential between neighboring steering waveguides when the phase tuners (discussed below) do not affect the phase differential, and $f_o$ is the phase of the output signal at the facet 18 of steering waveguide j=1. In some instances, this phase differential is achieved by constructing the steering waveguides such that the steering waveguides have a linearly increasing length differential. For instance, the length of steering waveguide j can be represented by $l_o+(j-1)\Delta l$ where j is an integer from 1 to N and represents the number associated with a steering waveguide when the steering waveguides are sequentially numbered as shown in FIG. 6, $\Delta l$ is the length differential between neighboring steering waveguide, and $L_o$ is the length of steering waveguide j=1. When the steering waveguides are the same length, the value of $\Delta l$ is zero and the value of f is zero. Suitable $\Delta l$ include, but are not limited to, Δl greater than 0, or 5 and/or less than 10, or 15 μm. Suitable f include, but are not limited to, f greater than 0π, or 7π and/or less than 15π, or 20π. Suitable N include, but are not limited to, N greater than 10, 100, or 1000 and/or less than 10000, or 50000. Suitable splitters include, but are not limited to, star couplers, cascaded Y-junctions and cascaded 1×2 MMI couplers.

A phase tuner 104 can be positioned along at least a portion of the steering waveguides 102. Although a phase tuner 104 is shown positioned along the first and last steering waveguide, these phase tuners are optional. For instance, the chip need not include a phase tuner on steering waveguide j=1.

The electronics can be configured to operate the phase tuners so as to create a phase differential between the output signals at the facet 18 of adjacent steering waveguides 102. The electronics can operate the phase tuners such that the phase differential is constant in that it increases linearly across the steering waveguides. For instance, electronics can operate the phase tuners such that the tuner-induced phase of steering waveguide number j is $(j-1)\alpha$ where j is an integer from 1 to N and represents the number associated with a steering waveguide when the steering waveguides are sequentially numbered as shown in FIG. 6, α is the tuner-induced phase differential between neighboring steering waveguides. Accordingly, the phase of steering waveguide number j is $f_o+(j-1)f+(j-1)\alpha$. FIG. 6 illustrates the chip having only 4 steering waveguides in order to simplify the illustration, however, the chip can include more steering waveguides. For instance, the chip can include more than 4 steering waveguides, more than 100 steering waveguides, or more than 1000 steering waveguides and/or less than 5000 steering waveguides.

The electronics can be configured to operate the phase tuners so as to tune the value of the phase differential α. Tuning the value of the phase differential α changes the direction that the LIDAR output signal travels away from the chip (θ). Accordingly, the electronics can scan the LIDAR output signal by changing the phase differential α. The range of angles over which the LIDAR output signal can be scanned is $\phi_R$ and, in some instances, extends from $\phi_v$ to $-\phi_v$ with φ=0° being measured in the direction of the LIDAR output signal when a=0. When the value of Δl is not zero, the length differential causes diffraction such that light of different wavelengths travels away from chip in different directions (θ). Accordingly, there may be some spreading of the outgoing LIDAR signal as it travels away from the chip. Further, changing the level of diffraction changes the angle at which the outgoing LIDAR signal travels away from the chip when α=0°. However, providing the steering waveguides with a length differential (Δl≠0) can simplify the layout of the steering waveguides on the chip.

Figure 7:
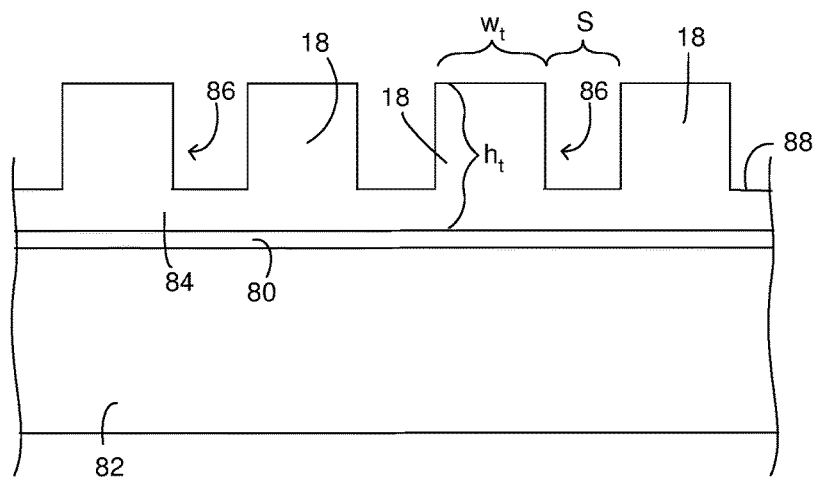
FIG. 7 is a sideview of the chip of FIG. 6 looking towards the facets from off of the chip.

FIG. 7 is a sideview of the chip looking towards the facets of the steering waveguides from off of the chip. The steering waveguides 102 are constructed according to FIG. 2. For instance, as shown in FIG. 2, the steering waveguides 102 have a width labeled w and a height labeled h. A thickness of the slab regions is labeled T. For LIDAR applications, these dimensions are more important than other applications because of the need to use higher levels of optical power than are used in other applications and to preserve relative phase in applications such as the steering waveguides. The ridge width (labeled w) is greater than 1 μm and less than 4 μm, the ridge height (labeled h) is greater than 1 μm and less than 4 μm, the slab region thickness is greater than or equal to 0.0 μm, or 0.05 μm and less than 3 μm. These dimensions can apply to straight or substantially straight portions of the waveguide, curved portions of the waveguide and tapered portions of the waveguide(s). Accordingly, these portions of the waveguide will be single mode. However, in some instances, these dimensions apply to straight or substantially straight portions of a waveguide while curved portions of the waveguide and/or tapered portions of the waveguide have dimensions outside of these ranges. For instance, the tapered portions of a waveguide can have a width and/or height that is >4 μm and can be in a range of 4 μm to 12 μm. Additionally or alternately, curved portions of a waveguide can have a reduced slab thickness in order to reduce optical loss in the curved portions of the waveguide. For instance, a curved portion of a waveguide can have a ridge that extends away from a slab region with a thickness greater than or equal to 0.0 μm and less than 0.5 μm. While the above dimensions will generally provide the straight or substantially straight portions of a waveguide with a single-mode construction, they can result in the tapered section(s) and/or curved section(s) that are multimode. Coupling between the multi-mode geometry to the single mode geometry can be done using tapers that do not substantially excite the higher order modes. Accordingly, the waveguides can be constructed such that the signals carried in the waveguides are carried in a single mode even when carried in waveguide sections having multi-mode dimensions.

Pitch is the distance between the facets of the steering waveguides and is labeled P in FIG. 7. The pitch can be measured center-to-center or from lateral side one facet 18 to the corresponding lateral side of the adjacent facet 18. Reducing the pitch increases the range of angles over which the LIDAR output signal can be scanned effectively. However, as the facets approach each other, evanescent coupling can occur. Evanescent coupling is prevented or reduced when the separation between the adjacent lateral sides of the facets 18 (labeled S in FIG. 7) is greater than 1 μm. This level of separation can also be applied to the portion of the steering waveguides located between the facets and the phase tuner in order to prevent or reduce coupling between adjacent steering waveguides.

Figure 8:
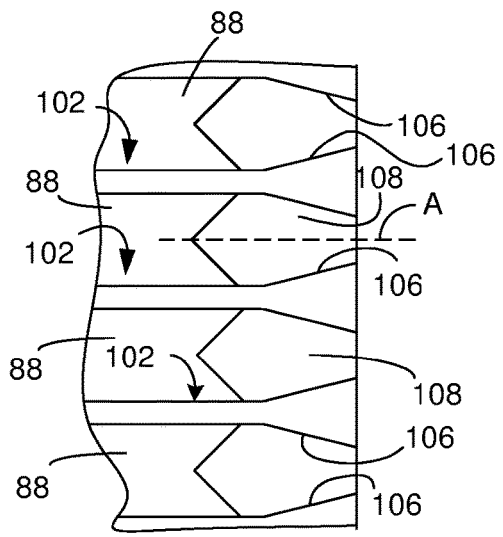
FIG. 8 is a topview of a chip having multiple steering waveguides that each includes a taper that terminates at a facet.

One or more of the steering waveguides can include tapers. For instance, FIG. 8 is a topview of a chip where at least a portion of the steering waveguides each includes a taper 106 that terminates at one of the facets 18. Although the tapers are shown terminating at the facets 18, the tapers can terminate before the facet 18. Accordingly, there can be an untapered portion of a steering waveguide between a taper and a facet 18. Although the tapers 106 in FIG. 8 are shown as expanding the width of the steering waveguides at they approach the facets, the tapers 106 can be constructed so as to contract the width of the steering waveguides at they approach the facets. Reducing the width of the steering waveguides at the facet can help bring the facets of different steering waveguides closer together. As a result, width-reducing tapers can preserve low pitch levels and while also permitting a separation level that prevents or reduce coupling between adjacent steering waveguides.

The tapers illustrated in FIG. 8 are horizontal tapers, however, the tapers can also be vertical. The width of the facet is labeled $w_t$ in FIG. 7 and the height of the facet is labeled $h_t$ in FIG. 7. The tapers can be constructed such that the width of the facet ($w_t$) is less than 30, 20, or 10 μm and/or greater than 5, 2, or 1 μm. Accordingly, an untapered portion of a steering waveguide located between the taper and the splitter 100 can have a width greater than 1 μm and less than 4 μm and a height greater than 1 μm and less than 4 μm and an untapered portion of a steering waveguide located between the taper and the facet and/or the facet itself can have a width greater than 1 µm and less than 4 µm and a height greater than 1 µm and less than 4 µm. Additionally or alternately, the tapers can be constructed such that the separation between adjacent facets is greater than 0.2, 0.3, or 0.4 µm and/or less than 0.6, 0.8, or 1 µm while the pitch is greater than 1.5, 3, or 6 µm and/or less than 10, 20, or 30 µm. With these dimensions and at 1550 nm wavelength, a scanning angle range ($\phi_R$) less than 60°, 30°, or 20° and/or greater than 5°, 3°, or 1° can be achieved.

Figure 9A:
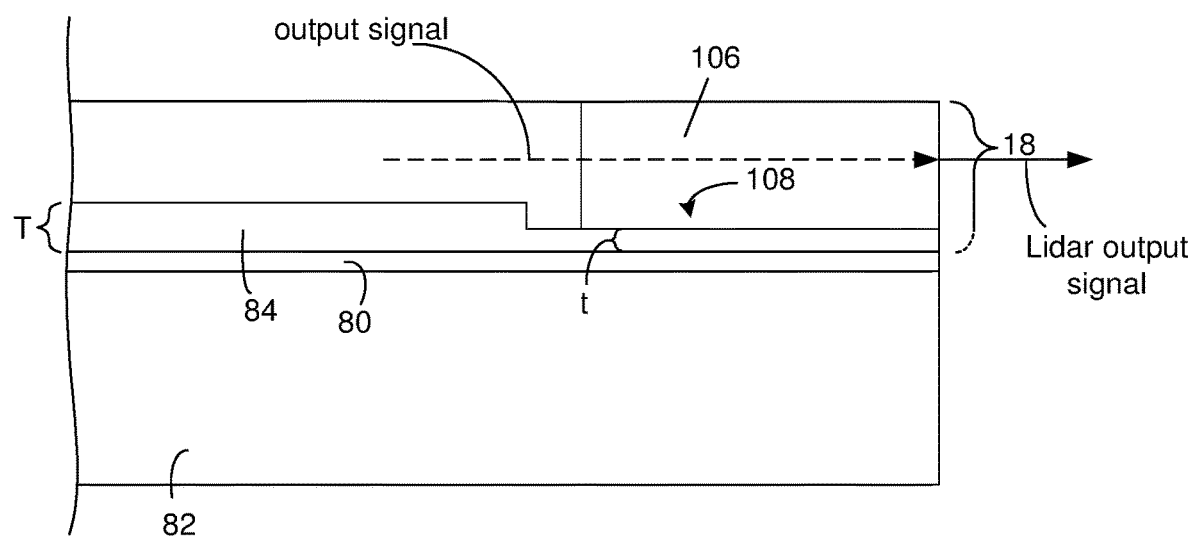
FIG. 9A is a sideview of a cross section of a portion of the chip shown in FIG. 8. The cross section is taken along the line labeled A in FIG. 8.
Figure 9B:
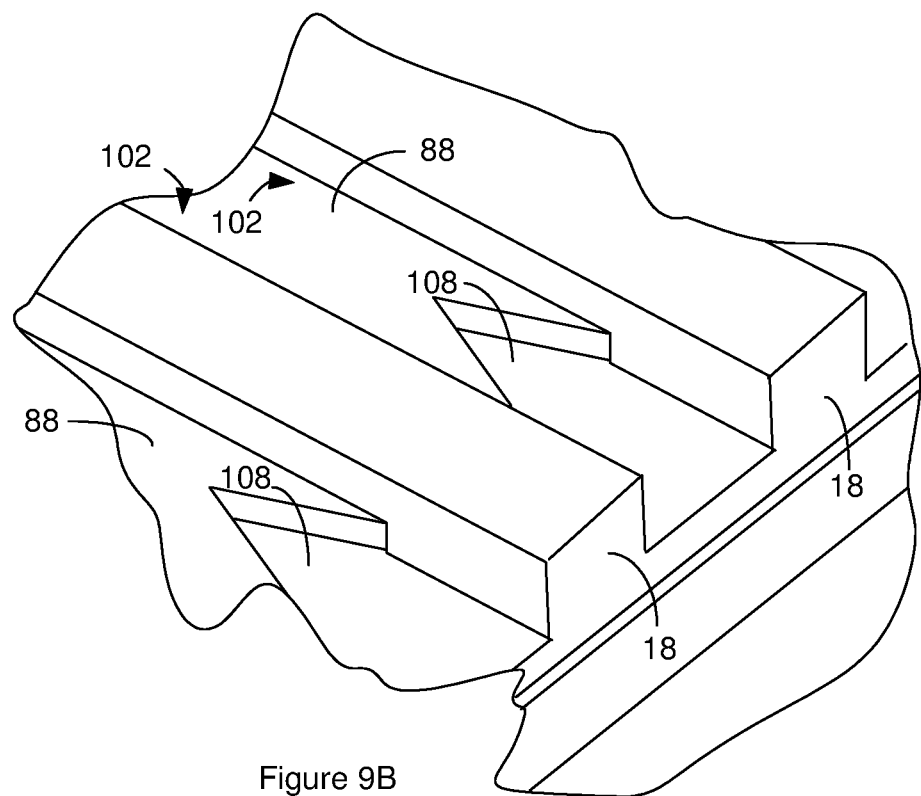
FIG. 9B is a perspective view of a portion of the chip shown in FIG. 8.

Optical coupling between steering waveguides in the region of the facets 18 can be reduced by reducing the thickness of the slab regions in the region of the facets 18. FIG. 9A is a sideview of a cross section of a portion of the chip shown in FIG. 8. The cross section is taken along the line labeled A in FIG. 8. Since FIG. 9A is a sideview, chip features that are in the background of the cross section are also illustrated. For instance, the cross section is taken through a slab region 88; however, a ridge of a steering waveguides 102 is visible behind the slab region 88. FIG. 9B is a perspective view of a portion of the chip shown in FIG. 8. The image shown in FIG. 9B does not include the tapers 106 that are shown in FIG. 8 although the slab region configuration shown in FIG. 9B can be used in conjunction with the tapers 106.

The steering waveguides 102 each extends from a slab region 88. The thickness of the slab regions 88 decreases as the slab region 88 approaches the facets and/or the lateral side of the chip. For instance, the slab regions include a recess 108 that extends at least partway into the slab region 88. When the recess 108 extends part way through the slab region 88 as shown in FIG. 9, the light-transmitting medium 84 at the bottom of the recess 108 can be continuous with the light-transmitting medium 84 in the slab region and accordingly serves as a reduced portion of the slab region 88. The thickness of slab region is labeled T in FIG. 9 and the thickness of reduced slab region is labeled t. A suitable thickness for the reduced slab regions at one or more locations selected from between the facets, adjacent to a facet and at a lateral side of the chip, between the tapers includes, but is not limited to, a thickness greater than or equal to 0.0 µm and less than 0.2 µm or 0.5 µm. The chip can be constructed such that a ratio of the slab region thickness (T): reduced slab region thickness (t) is greater than 1.2:1, 2:1 or 4:1 and/or less than 10:1, or 5:1.

Figure 9C:
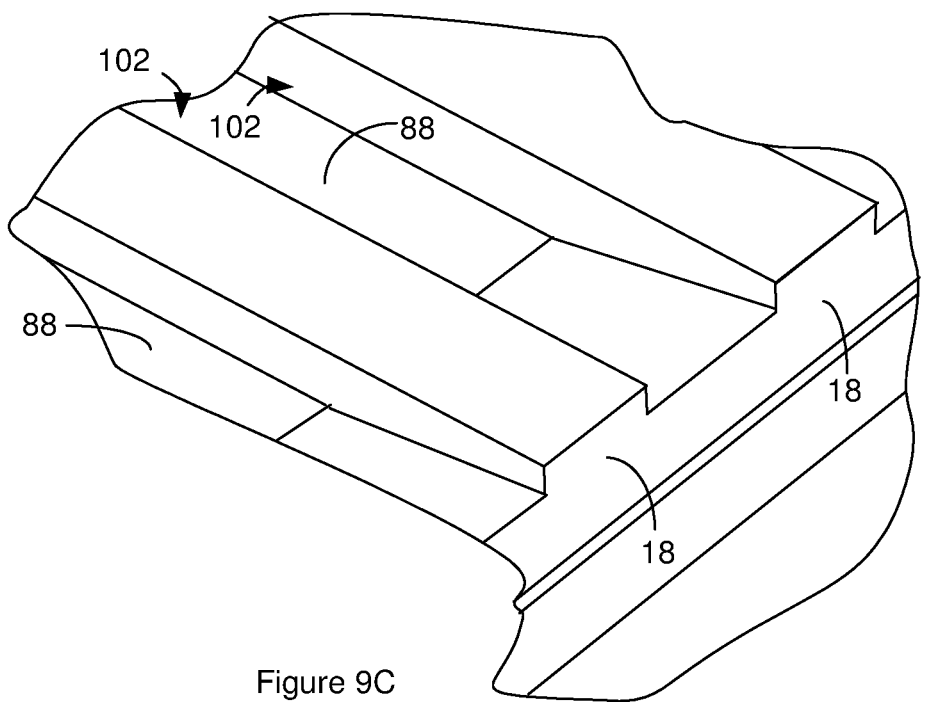
FIG. 9C is a perspective view of a portion of a chip having tapered slab regions.

The slab regions can taper vertically and/or horizontally near the facets. For instance, FIG. 9C is a perspective view of a portion of the chip shown in FIG. 8. The portion of the slab region adjacent to the facets tapers vertically such that the thickness of the slab regions increases as the slab regions approach the facet. The tapers 106 are not shown in FIG. 9C in order to simplify the drawing. However, the vertical and/or horizontal tapers of the slab regions can be used in conjunction with steering waveguide 102 tapers 106 such as are shown in FIG. 8 or tapers 106 that become narrower as the approach the facet. Accordingly, vertical taper(s) of the slab regions such as is shown in FIG. 9C can be positioned between tapered 106 regions of the steering waveguides. Such an arrangement can reduce optical loss.

In some instances, the steering waveguides 102 are designed such that the length of the steering waveguides 102 increases linearly. For instance, the length of steering waveguides j can be represented by $L_o+(j-1)\Delta L$ where j is an integer from 1 to N and represents the number associated with a steering waveguide when the steering waveguides are sequentially numbered as shown in FIG. 6, $\Delta L$ is the length differential between neighboring steering waveguide, and $L_o$ is the length of steering waveguide j=1. As noted above, this length differential results in the phase of steering waveguide number j being represented by $f_o+(j-1)f+(j-1)\alpha$.

The length differential causes diffraction such that light of different wavelengths travels away from chip in different directions ($\theta$). The combination of the angles that can be reached with this wavelength dependent diffraction and by tuning the phase tuners 104 increases the range of angles over which the LIDAR output signal can be scanned is $\phi_R$. For instance, with the above steering waveguide configurations, scanning angle ranges ($\phi_R$) greater than 40°, 50°, or 60° and/or less than 70°, 80°, or 90° can be achieved using output waveguide pitches of up to 30 µm. Suitable $\Delta L$ include, but are not limited to, $\Delta L$ greater than 0, or 100 µm and/or less than 200, or 300 µm. Suitable N include, but are not limited to, N greater than 100, or 1000 and/or less than 10,000, or 50,000.

In order to increase the range of wavelengths that can be included in the LIDAR output signal, the chip can include multiple different laser cavities and a multiplexer in place of the laser cavity on the chip of FIG. 1. The multiplexer can receive an output from each of the laser cavities and combine the outputs to form the outgoing LIDAR signal that is received by the utility waveguide 16 of FIG. 1. The electronics can operate the laser cavities sequentially such that LIDAR output signals of different wavelengths are sequentially output from the chip. The electronics can operate the phase tuners to sequentially scan the LIDAR output signals of different wavelengths. Alternately, the electronics can operate two or more of the laser cavities concurrently such that that the LIDAR output signal includes light from multiple different laser cavities. The electronics can operate the phase tuners to scan the LIDAR output signal that includes light from multiple different laser cavities. Since the value $\Delta L$ is a different percentage of the different wavelengths, LIDAR output signals having different wavelengths travel away from the chip in different directions.

Figure 10:
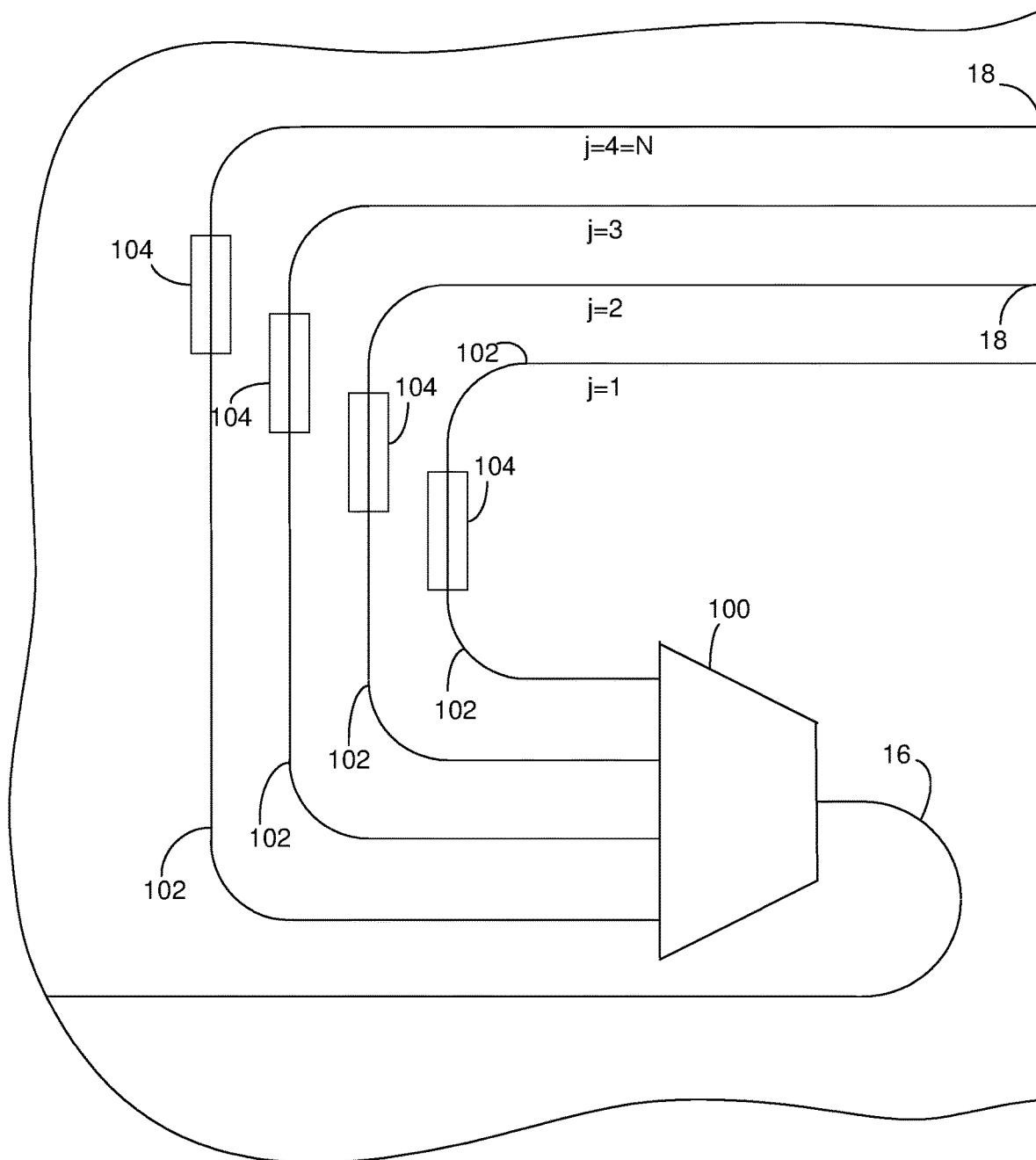
FIG. 10 illustrates a portion of a chip having a steering waveguides layout that is suitable for construction of steering waveguides with increasing lengths.

The layout of steering waveguides shown in FIG. 6 is suitable for construction of steering waveguides having the same length or substantially the same length. However, other steering waveguides layouts are possible. For instance, FIG. 10 illustrates a portion of a chip having a steering waveguides layout that is more suitable for construction of steering waveguides having increasing lengths.

Figures 11, 12:
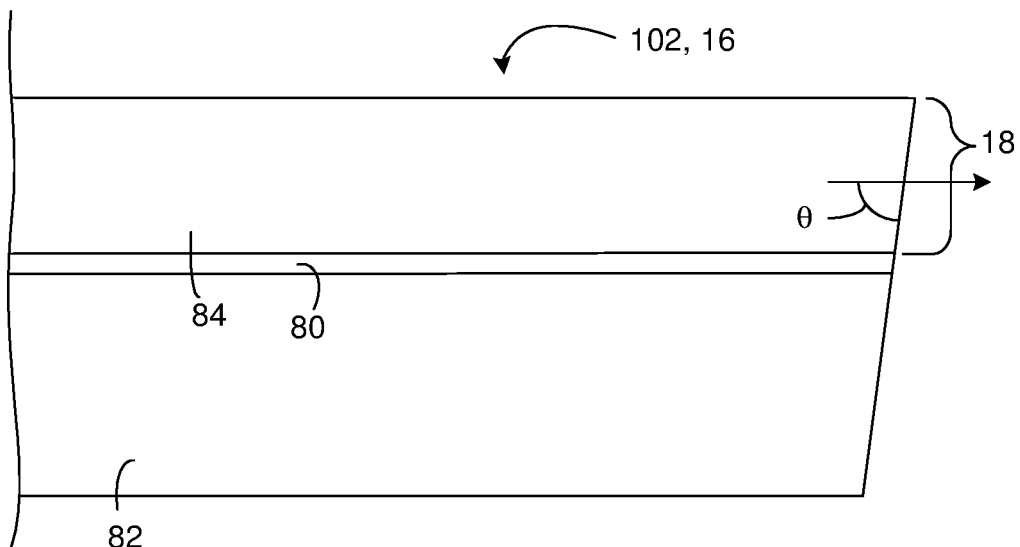
FIG. 11 is a cross section of a waveguide that terminates at a facet.
FIG. 12 shows target LIDAR specifications suitable for self-driving cars.

The steering waveguides can be constructed such that the direction of propagation the output signals in the steering waveguides at the facets is substantially parallel to the plane of the device, an upper surface of the substrate and/or a lower surface of the substrate. In some instances, the above facets 18 are perpendicular or substantially perpendicular relative to the base and/or an upper surface of the substrate and/or a lower surface of the substrate. Additionally or alternately, the facets 18 can also be constructed such that the smallest angle between the plane of facet and the direction of propagation of the output signals at the facet is between 80° and 90°. For instance, FIG. 11 is a cross section of a waveguide such as a utility waveguide 16 or a steering waveguide 102 wherein the angle $\theta$ represents the smallest angle between the facet and the direction of propagation of the output signals. Suitable values for the angle include, but are not limited to, angles greater than 10°, 9°, or 8° and/or less than 7°, 6°, or 5°.

Suitable phase tunes include, but are not limited to, PIN diodes for carrier-injection, heaters for thermal tuning or semiconductor optical amplifiers (SOAs). An example of phase tuner(s) that are integrated with ridge waveguides on a chip constructed from a silicon-on-insulator wafer can be found in U.S. patent application Ser. No. 09/083,395, filed on May 22, 1998, issued on Jun. 1, 1999 with U.S. Pat. No. 5,908,305 and incorporated herein in its entirety. The phase tuner(s) can be a component that is separate from the chip and then attached to the chip. For instance, the phase tuner(s) can be included on a phase tuner chip that is attached to the chip in a flip-chip arrangement. As an alternative to including a phase tuner(s) on a separate component, all or a portion of the phase tuner(s) can be integrated with the chip.

Suitable electronics can include, but are not limited to, a controller that includes or consists of analog electrical circuits, digital electrical circuits, processors, microprocessors, digital signal processors (DSPs), Field Programmable Gate Arrays (FPGAs), computers, microcomputers, or combinations suitable for performing the operation, monitoring and control functions described above. In some instances, the controller has access to a memory that includes instructions to be executed by the controller during performance of the operation, control and monitoring functions. Although the electronics are illustrated as a single component in a single location, the electronics can include multiple different components that are independent of one another and/or placed in different locations. Additionally, as noted above, all or a portion of the disclosed electronics can be included on the chip including electronics that are integrated with the chip.

Although the laser cavity is shown as being positioned on the chip, all or a portion of the laser cavity can be located off the chip. For instance, the utility waveguide 16 can terminate at a second facet through which the outgoing LIDAR signal can enter the utility waveguide 16 from a laser cavity located off the chip.

The chip can include components in addition to the illustrated components. As one example, optical attenuators (not illustrated) can be positioned along the first detector waveguide 36 and the second detector waveguide 38. The electronics can operate these attenuators so the power of the first portion of the composite sample signal that reaches the first light sensor 40 is the same or about the same as the power of the second portion of the composite sample signal that reaches the second light sensor 42. The electronics can operate the attenuators in response to output from the first light sensor 40 which indicates the power level of the first portion of the composite sample signal and the second light sensor 42 which indicates the power level of the second portion of the composite sample signal.

Alternate constructions and/or operations of the data branch 24 can be employed. For instance, U.S. Provisional Patent Application Ser. No. 62/671,913, filed on May 15, 2018 and incorporated herein in its entirety discloses an alternative data branch 24 structure and an alternative method for generating data from a data branch 24.

The disclosed LIDAR chips can be used in a variety of different applications including self-driving cars. Example performance targets suitable for self-driving car applications are shown in FIG. 12. The requirements indicate a total number of sample locations per field view of (30/0.1+1)*(60/0.1+1)=180,901. For a refresh rate of 30 frames per second, this gives 30*180,901=5,427,030 sample locations per second that need to be measured. When a single LIDAR chip is used for each sample location, this translates to a maximum measurement time per sample location of 1/(5,400,000)=0.184 µs. Since operating the LIDAR chips using FMCW measurements can consume about 4 µs to take a measurement at a single sample location, a single LIDAR output signal can effectively take measurements at each of the sample locations within the specified time limits. As a result, multiple LIDAR output signals are used in order to satisfy these performance requirements.

Figure 13:
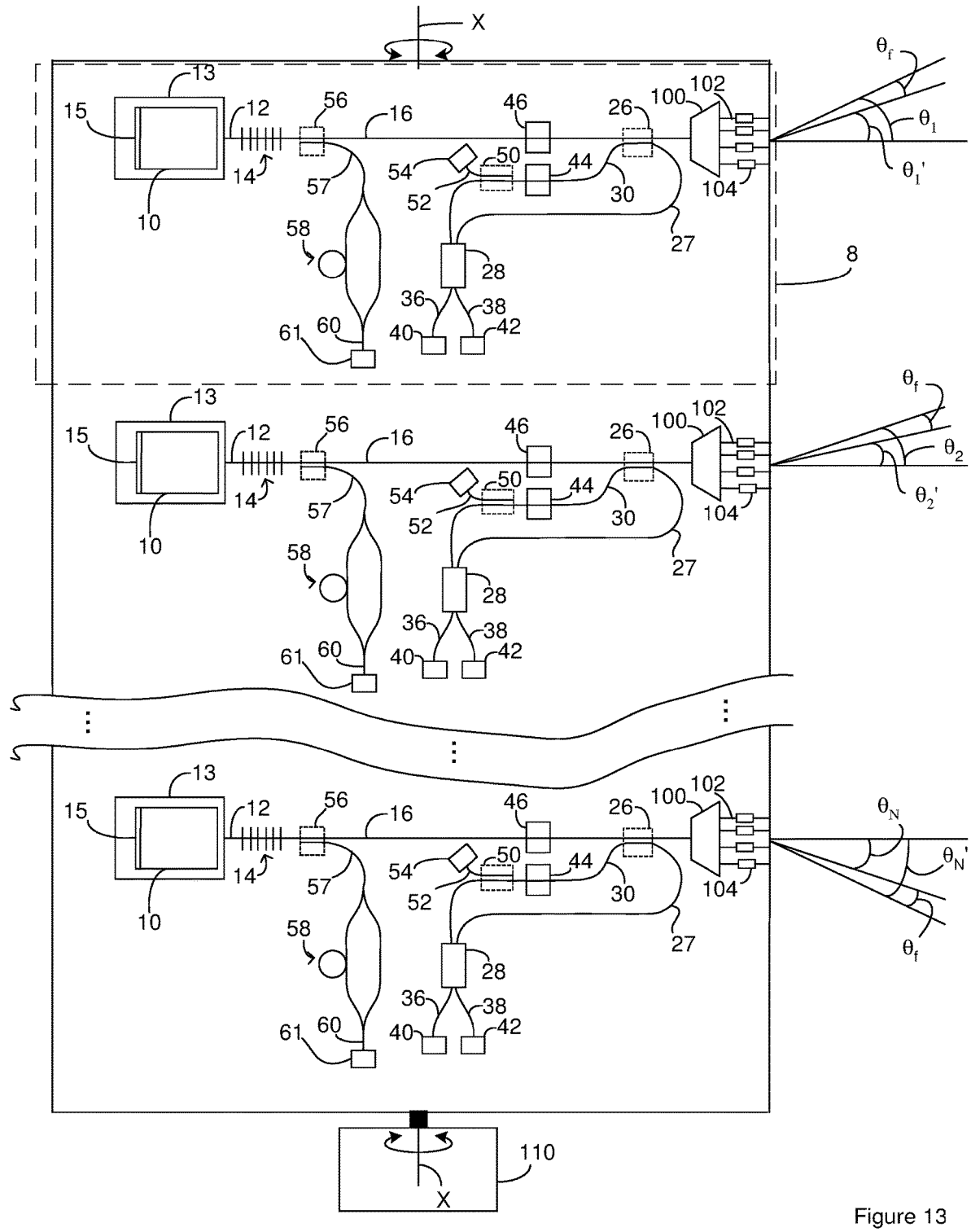
FIG. 13 presents a configuration of a composite LIDAR chip configured to generate multiple LIDAR output signals.

FIG. 13 presents a configuration of a composite LIDAR chip configured to generate multiple LIDAR output signals. The composite LIDAR chip incorporates the component assembly 8 from multiple LIDAR chips onto a single chip. Each of the component assemblies is constructed and operated as disclosed above. The arrangement of the splitter 100, steering waveguides 102, and phase tuners 104 are greatly simplified in FIG. 13 in order to simplify the illustration; however, the component assemblies can include these components arranged and operated as disclosed elsewhere.

Each of the component assemblies on the composite LIDAR chip is configured to generate a different LIDAR output signal. The different LIDAR output signals are labeled n=1 through N. The value of N is the total number of LIDAR output signals being generated for measuring the different sample locations in the field of view. For instance, in the above example of a self-driving car, the field of view can be divided into 600 columns and 300 rows of sample locations that are each sampled in 1/30th of a second. If the 600 columns are scanned serially, then there are 55.5 microseconds ((1/30)/600) available to scan the 300 sample locations arranged vertically in each column. The description of sample locations arranged in rows and columns is provided for exemplary purposes as the sample locations can be arranged in a variety of other configurations and/or can be random. Further, the sample locations can be periodically spaced or the spacing can change between the sample locations.

The measurement period is the time period needed to generate the LIDAR output signals and do the associated processing of the LIDAR input signal from a single sample location. The measurement period for an example self-driving car application is around 4 microseconds. If the N LIDAR output signals are generated and processed in parallel for a measurement period of 4 microseconds, there are 13 cycles (55.5 microseconds/4 microseconds/cycle=13.75 maximum cycles but provides 13 because the number of cycles is an integer) available to operate the N LIDAR output signals in parallel during the 55.5 microsecond period of time. As a result, at least 24 LIDAR output signals (300 sample locations/(13 cycles)=23.1 sample locations per cycle minimum but provides 24 because the total number of sample locations per cycle is an integer) can satisfy the performance requirements. Using at least 24 LIDAR output signals/cycle at 4 microseconds/cycle for 13 cycles provides measurements for 312 vertical sample locations in 52 microseconds which is a performance level that exceeds the needed values.

The number of LIDAR output signals that a chip needs to resolve the each of sample locations in a single field of view (N) can be determined from the following Equation 1:N is greater than or equal to $mP_T/t_T$ where $P_T$ is the total number of sample locations in the field of view, $t_T$ is total time to measure all of the sample locations (the inverse of the frame refresh rate shown in FIG. 12), and m is the time needed to take the measurement of a single sample location. As an example where the field of view has the sample locations arranged in two or more sets of parallel or substantially parallel lines where each sample location is included in one line from the first set of parallel lines and also in one line from the second set of parallel lines such as occurs when the sample locations are arranged in rows and columns, N is greater than or equal to $P_{d1}/n_c$ where $n_c \leq (t_T/m*P_{d2})$ where $P_{d1}$ is the number of lines of sample locations included in a first set of parallel lines (i.e. the number of rows of sample locations in the field of view), $P_{d2}$ is the number of lines of sample locations included in a second set of parallel lines (i.e. the number of columns of sample locations in the field of view). In some instances, the value of m is greater than or equal to 2 microseconds and/or less than 5 microseconds for certain self-driving car applications. However, the values for m can be smaller for short-range applications and/or applications with a high frame refresh rate. In these instances, suitable values for m include values greater than or equal to 0.05 microseconds and/or less than 5 microseconds. The symbol $n_c$ can be a positive integer that is greater than zero, 1, 2, or 3 and represents the number of cycles discussed above. Accordingly, $n_c$ can represent the number of locations that each one of at least a portion of the LIDAR output signals measures in a row or in a column during one measurement of the field of view. The value of N is a positive integer that is greater than zero and can be the higher of $P_{d1}$ or $P_{d2}$ when the field of view has the sample locations arranged in two or more groups of parallel lines. $P_{d1}$ can be the number of rows in the array and $P_{d2}$ can be the number of columns in the field of view. Alternately, $P_{d1}$ can be the number of columns in the field of view and $P_{d2}$ can be the number of rows in the field of view. In some instances, $P_{d1}$ and/or $P_{d2}$ are greater than 10, or 100 and/or less than 1000, or 1,000,000. The array can be a square array or can be a hexagonal array. In the above example of a self-driving car, $P_{d1}$ can be 300 and $P_{d2}$ can be 600 or $P_{d1}$ can be 600 and $P_{d1}$ can be 300, $t_T$ can be (1/30)s; and m can be 4 microseconds. Resolving these equations for applications such as self-driving cars results in LIDAR chips that generate at least 24, or 25 LIDAR output signals for each of the fields of view to be resolved by the LIDAR chip. A field of view can be defined as continuous, touching, or overlapping sample locations.

The electronics can be configured to scan each of the different LIDAR output signals over the same, substantially the same, or different angular range of $O_f$. The value of $O_f$ is the angular range over which each of the LIDAR output signals is scanned during a cycle and can be selected such that N LIDAR output signals can scan the required number of sample locations within the desired time period. For instance, in the self-driving car example set forth above, the composite chip has at least 24 LIDAR output signals that need to scan at least 30° in maximum increments of 0.1° although smaller increments can be used. As a result, each of the 24 LIDAR output signals needs to be scanned over at least 1.25° (30°/13 cycles)=1.25°. Accordingly, 1.25° can serves as a minimum for the value of the angular range ($\theta_f$) in the above example of a self-driving car. An angular range ($\theta_f$) of 1.25° can be used with increments less than 0.1° and an angular range ($\theta_f$) of 1.3° can be used with increments of 0.1°. As the number of LIDAR output signals increases the value of the angular range can be decreased.

As noted above, the scanning angle range ($\phi_R$) for one LIDAR output signal is limited. As a result, the LIDAR output signals can be woven together to get the total target scanning angle for the LIDAR system. As a result, the scan angles ($\theta$) that are included in the scanning angle range ($\phi_R$) for each LIDAR output signal can be different. For instance, the scan angles ($\theta$) for LIDAR output signal n ($\theta_n$) can include or consist of angles in a range from $\theta_n$ to $\theta_n'$ where $\theta_n = \theta_{(n-1)}'$ to $\theta_n' = \theta_n + \theta_f$ where $\theta_0 = -\theta_T/2°$, $\theta_T$ represents the total target scanning angle, and $\theta_f$ can be $\theta_T/N$. Alternately, the scan angles ($\theta$) for LIDAR output signal can include or consist of $\theta_n$ to $\theta_n'$ where $\theta_n = (2n-2-N)\theta_T/2N$ to $\theta_n' = (2n-N)\theta_T/2N$. These equations assume the adjacent scan angles are continuous or contact one another (i.e. $\theta_n = \theta_{(n-1)}'$); however, the adjacent scan angle ranges can overlap. Accordingly, $\theta_n$ can extend from $\theta_n \leq \theta_{(n-1)}'$ to $\theta_n' \geq \theta_n + \phi_R$ and/or $\theta_n \leq (2n-2-N)\theta_T/2N$ to $\theta_n' \geq (2n-N)\theta_T/2N$. Accordingly, $\phi_R$ can be $\theta_T/N$. In the above example of a self-driving car, when the component assemblies are arranged vertically, the value of $\theta_T$ is 30° and when the component assemblies are arranged horizontally, the value of $\theta_T$ is 60°.

The above discussion provides scanning of the field of view in the vertical direction, however, that leaves 600 sample locations arranged horizontally. The composite chip can be moved relative to the reflecting object so as to provide horizontal scanning. For instance, the composite LIDAR chip can be rotated around an axis such as the axis labeled X in FIG. 13. The electronics can be in communication with an actuator 110 for moving the composite chip relative to the reflecting object. Examples of suitable actuators include, but are not limited to, electric motors, and piezo-driven rotary actuators. The movement can be controlled so that the LIDAR output signals can sequentially move the LIDAR output signals to each of the columns.

As an alternative to moving the composite LIDAR chip and/or in addition to moving the composite LIDAR chip, one or more reflecting devices can be employed to control the direction of the LIDAR output signals as disclosed in the context of FIG. 3 through FIG. 5. Each reflecting device can move a single LIDAR output signal or a reflecting device can move multiple LIDAR output signals. Accordingly, one or more reflecting devices can be used to move the LIDAR output signals. The one or more reflecting devices can be operated so as to sequentially move the LIDAR output signals to each of the columns.

The movement of the LIDAR output signals can be controlled so that the LIDAR output signals can sequentially scan each of the columns. Accordingly, the composite chip can be operated by sequentially moving the LIDAR output signals such that LIDAR output signals sequentially move from one column of sample locations in the field of view to another column of sample locations in the field of view until the LIDAR output signals have been incident on sample locations in each column in the field of view. While the LIDAR output signals are incident on sample locations in a column, the electronics can operate the phase tuners so each of the sample locations in the column receives one of the LIDAR output signals. Accordingly, measurements can be taken at each of the sample locations in a column. Taking measurements at each sample location in a column combined with the movement of the LIDAR output signals from column to column provides measurements in the entire field of view.

Generating and receiving the LIDAR output signals requires only a fraction of the measurement period. For instance, generating and receiving the LIDAR output signals during the first sample and the second sample requires only a portion of the measurement period while processing of the results can require another portion of the measurement period. As noted above, the measurement period can be about 4 microseconds but only about 2.6 microseconds of the measurement period includes generating and receiving the LIDAR output signals during the first sample and the second sample; however, the LIDAR output signals can be generated and transmitted during the entirety of the first sample and the second sample. While the electronics are processing the results, the electronics can operate the actuator so as to move the LIDAR output signals to another column in the field of view. Accordingly, movement of the composite LIDAR chip from one column to the next does not add delay between the measurement periods. As a result, the total time needed to measure the entire field of view is the number of columns in the field of view multiplied by the measurement period multiplied by the number of cycles needed to take the measurements in a column. In the above example of a self-driving car, this amounts to 600 columns× 13 cycles per column×4 microseconds per cycle=0.0312 seconds which is less than the 0.033 second allowed by the self-driving car specifications.

Portions of the above discussion disclose that the movement of the LIDAR output signals is stopped during the movement of the LIDAR output signals from one set of sample locations to another set of sample locations. However, in many instances, the movement of the LIDAR output signals is continuous both while the sample locations are illuminated by the LIDAR output signals and when the LIDAR output signals are between sample locations. When there is not delay between cycles and/or sample periods, the continuous scan mechanism can result in sample locations that touch one another and/or overlap.

The above mechanisms for scanning the field of view can be performed such that each sample location in a field of view is illuminated by one of the LIDAR output signals at least once during a scan of the field of view; however, some of the sample locations may be illuminated more than once during a single scan of a field of view. Accordingly, the electronics have an opportunity to generate LIDAR data for each sample location in the field of view. Accordingly, the electronics can generate LIDAR data or attempt to generate the LIDAR data each sample location in the field of view in a single scan of the field of view.

Although the above description of the composite LIDAR chip configuration is disclosed in the context of using at least one phase tuner to scan the LIDAR output signals vertically, the above teachings can be applied with the vertical and horizontal spatial arrangements inverted. Accordingly, the LIDAR chip configuration can be operated by using the at least one phase tuner to scan the LIDAR output signals horizontally and using the actuator to scan the LIDAR output signals vertically.

Figure 14:
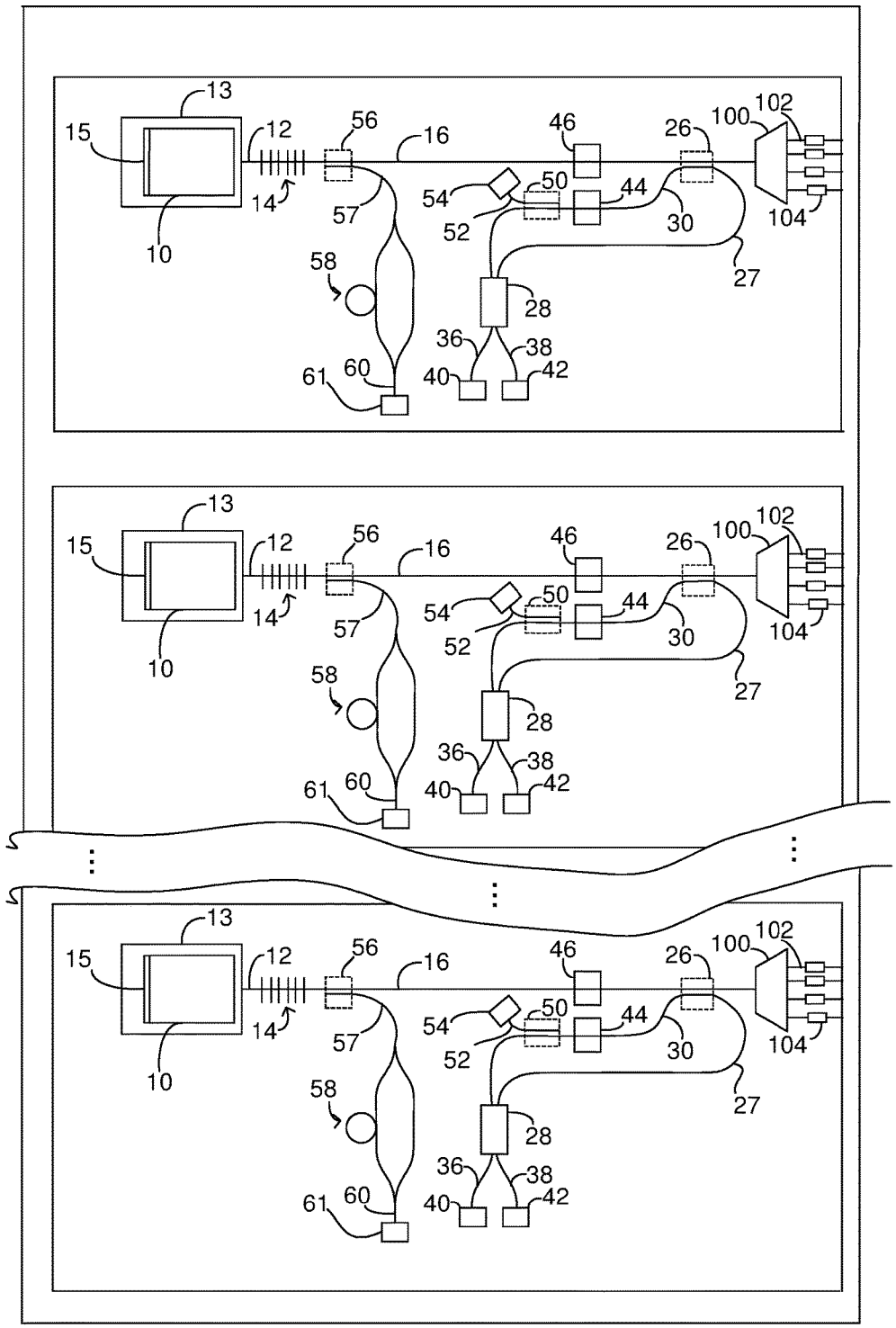
FIG. 14 presents a configuration of a composite LIDAR chip with multiple LIDAR chips on a common substrate.

The composite chip in FIG. 13 shows each of the component assemblies fabricated on the same die. For instance, each of the component assemblies is positioned on the same base or substrate. However, a composite LIDAR chip can be constructed from multiple LIDAR chips that are each fabricated on their own die. The different LIDAR chips can be positioned on a common base or a common substrate as shown in FIG. 14.

In some instances, cross talk between different LIDAR output signals can occur. This issue can be addressed by operating the composite LIDAR chip such that different LIDAR output signals have different wavelengths. When the LIDAR output signals have sufficiently different wavelength, the beat frequency experienced as a result of crosstalk with another LIDAR output signal occurs at a significantly different frequency to the beat frequency for the intended signal. As a result, the electronics can include a filter that filters out the contribution of the crosstalk to the beating signal. For instance, the electronics can include a filter that filters out the contribution of particular frequencies from the data signal so the electronics operate on a data signal having frequencies within a particular range.

Although the one or more laser cavities are shown above as being positioned on the chip, all or a portion of the laser cavity can be located off the chip. For instance, the utility waveguide 16 can terminate at a second facet through which the outgoing LIDAR signal can enter the utility waveguide 16 from a laser cavity located off the chip. When a laser cavity is positioned off the chip, the electronics can use the control branch 55 to control operation of the external laser cavity as disclosed above.

Figure 15:
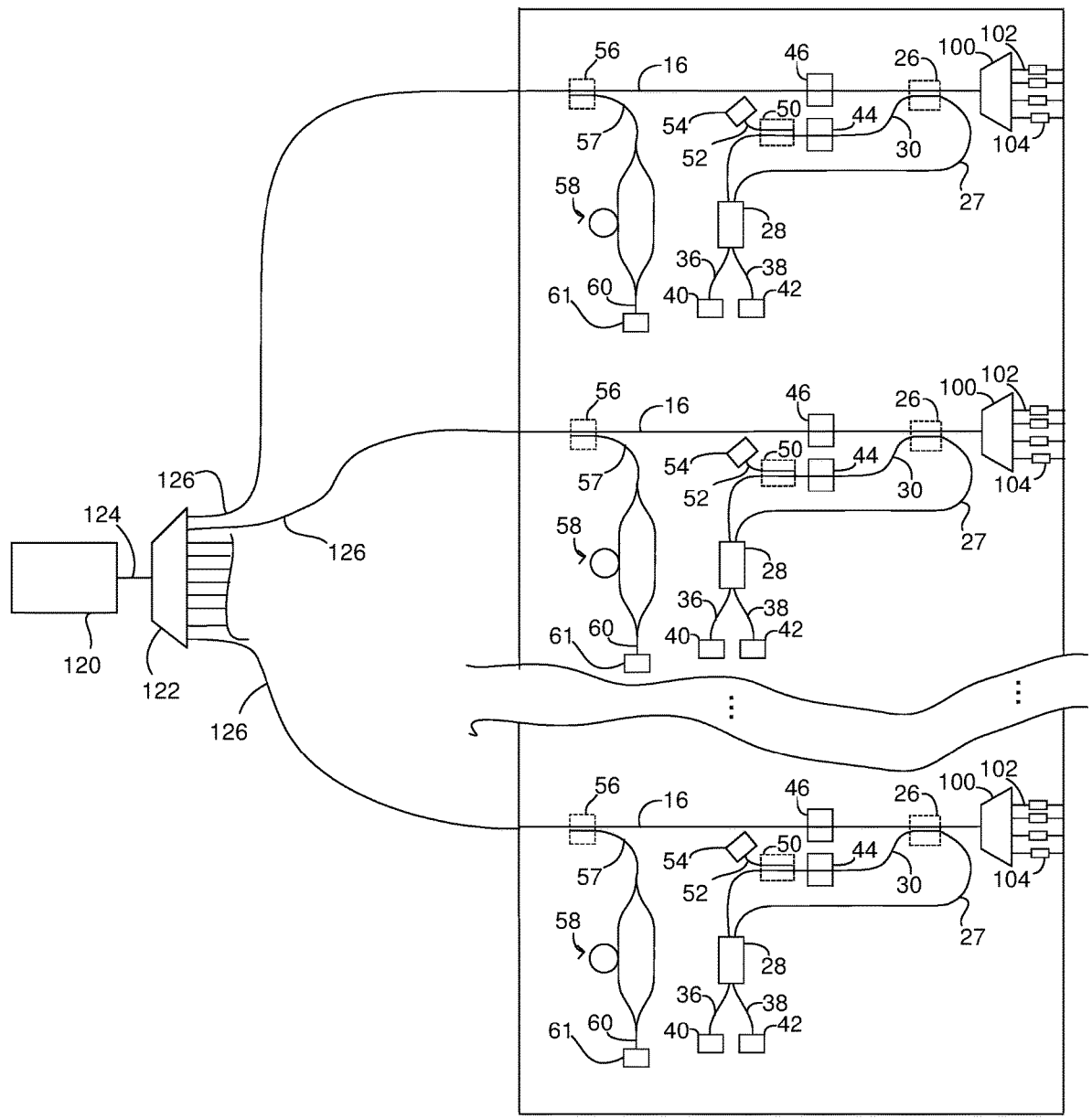
FIG. 15 illustrates a system that has a LIDAR chip that includes multiple optical assemblies such as the LIDAR chip of FIG. 13 and/or FIG. 14. At least a portion of the optical assemblies each receives light from a common laser cavity.

Different optical assemblies can receive the outgoing LIDAR signal from a common laser cavity. As an example, FIG. 15 illustrates a system that has a LIDAR chip that includes multiple optical assemblies such as the LIDAR chip of FIG. 13 and/or FIG. 14. At least a portion of the optical assemblies each receives light from a common laser cavity. For instance, multiple optical assemblies each includes a utility waveguide 16 that receives an outgoing LIDAR signal from a common laser cavity 120.

The system of FIG. 15 can include a splitter 122 that receives a cavity output from the common laser cavity 120 on a laser waveguide 124. The system can also include multiple intermediate waveguides 126 that each receives a portion of the cavity output from the splitter 122. The intermediate waveguides 126 each carries one of the received portions of the cavity output to one of the optical assemblies on the LIDAR chip. Suitable laser waveguides 124 include, but are not limited to, optical fibers. Suitable intermediate waveguides include, but are not limited to, optical fibers, and integrated optical waveguides. Suitable splitters include, but are not limited to, fiber splitters, integrated optical splitters. Suitable lasers include, but are not limited to, DFBs, DBRs.

Although FIG. 15 shows all of the optical assemblies receiving the outgoing LIDAR signal from the same common laser cavity, different portions of the optical assemblies on the same composite LIDAR chip can receive the outgoing LIDAR signal from different common laser cavities and/or different laser cavities.

Although FIG. 15 shows a laser cavity positioned off the composite LIDAR chip, one or more common laser cavities can be included on a composite LIDAR chip. Accordingly, the splitter, laser waveguide(s) and intermediate waveguide (s) can be located on the composite LIDAR chip.

Although the composite LIDAR chips are disclosed in the context of self-driving cars, the composite LIDAR chips can be used in other applications such as autonomous control of other types of vehicle including airborne and undersea vehicles, robots, augmented reality, industrial surveying and control, healthcare monitoring and biometric identification.

Example 1

Figure 16:
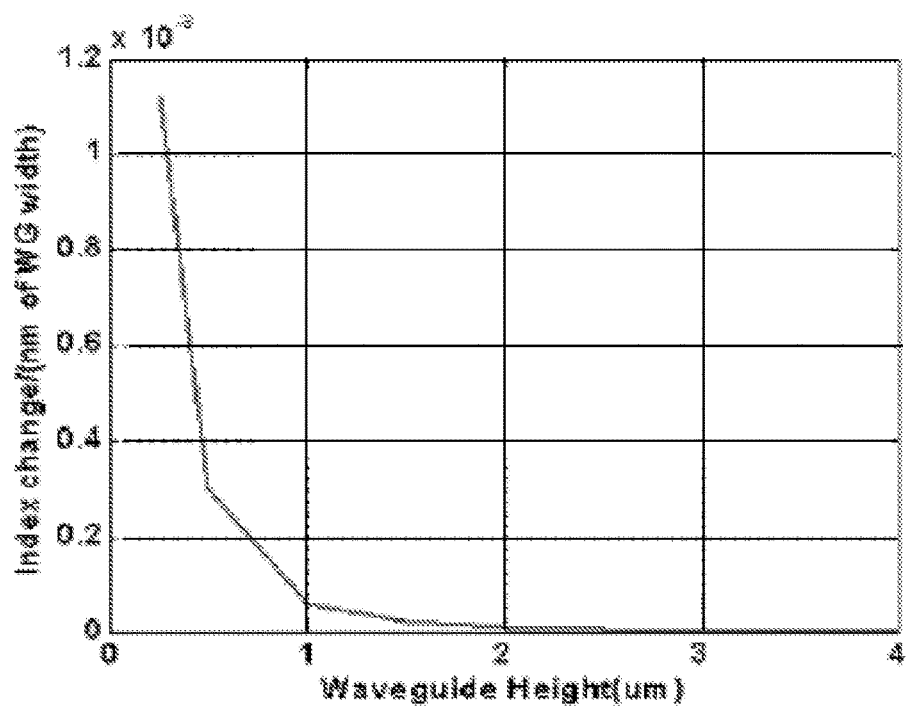
FIG. 16 is a graph of change in the effective index of refraction of a waveguide as a function of the waveguide height.

Waveguides constructed according to FIG. 2 on a silicon-on-insulator wafer were simulated to determine the change in effective index of refraction/width of waveguide. FIG. 12 presents the resulting index change as a function of the waveguide height. FIG. 16 shows that the level of index change is a strong function of waveguide diameter (height) at heights above 1 µm but that the functionality suddenly drops to near as zero the diameter (height) passes 1 µm.

Example 2

Figure 17:
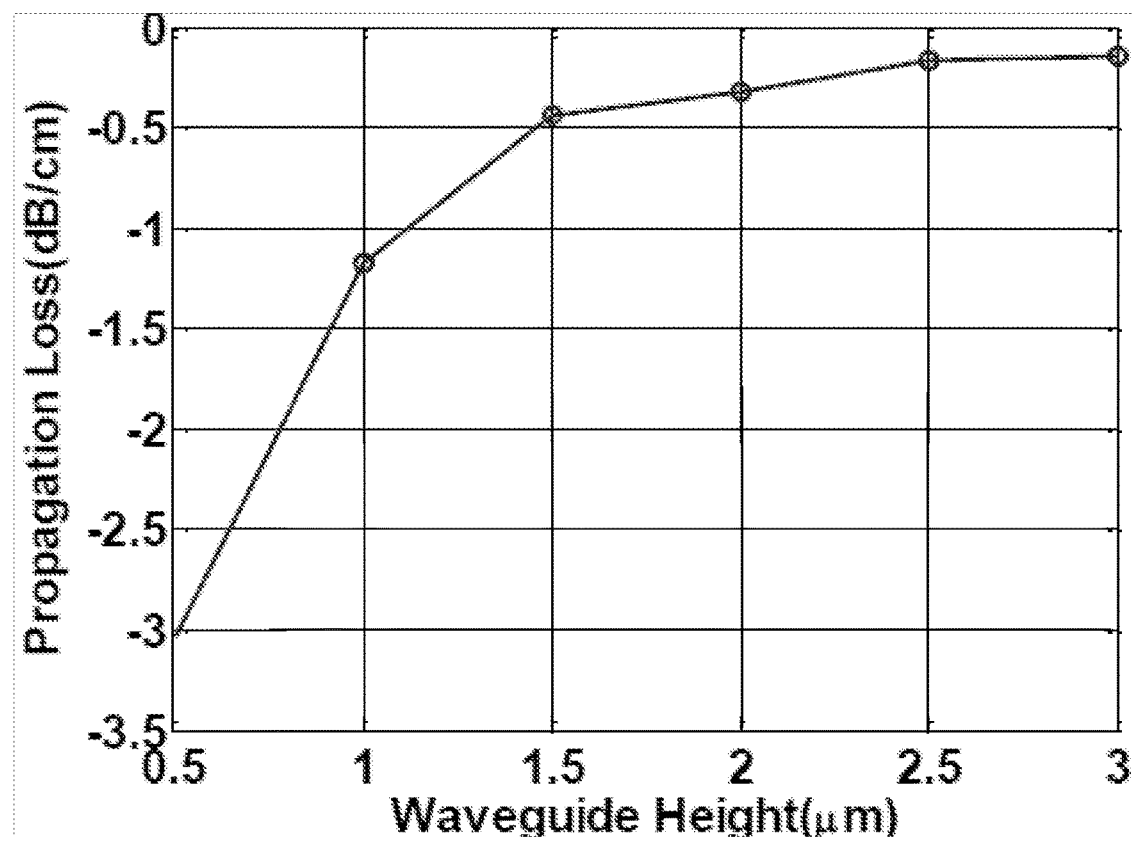
FIG. 17 a graph of propagation loss in a waveguide as a function of waveguide height.

Waveguides were constructed according to FIG. 2 on a silicon-on-insulator wafer and tested for propagation loss. FIG. 13 presents the resulting propagation levels as a function of the waveguide height. The level of propagation loss tails off as the waveguide height passes 1 µm. The sharpness of the tail off evident in FIG. 17 may be reduced due to the logarithmic scale associated with the dB dimensions shown on the y-axis.

Example 3

Figure 18:
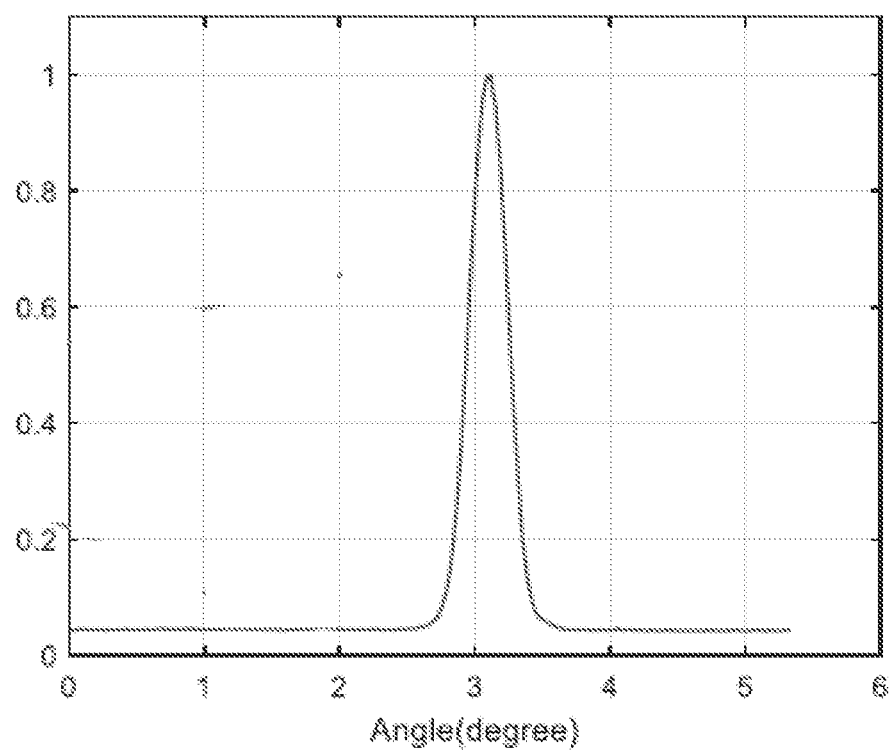
FIG. 18 is a graph of intensity versus angle.

First waveguides were constructed according to FIG. 2 on a silicon-on-insulator wafer. The first waveguides had height of 3 µm, a width of 3 µm, and a slab thickness of 0.25 µm. The results for intensity versus beam steering angle are shown in FIG. 18. The side lobes that are present when using the same waveguide structure with a height of 0.5 µm are not evident in FIG. 14.

Although the LIDAR chips are disclosed in the context of Frequency Modulated Continuous Wave (FMCW) operations, the above chips can be adapted to time-of-flight operations.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. A LIDAR chip, comprising:
multiple component assemblies that are each configured to generate and steer a direction of a LIDAR output signal that exits from the chip, the LIDAR output signals generated from different components assemblies having different wavelengths.

2. The chip of claim 1, wherein each LIDAR output signal is associated with an index n=1 through N and a scan angle for LIDAR output signal n ($\theta_n$) is different for each LIDAR output signal and includes angles in a range from $\theta_n$ to $\theta_n'$ where $\theta_n = \theta_{(n-1)}'$ and $\theta_n \theta_f$ where $\theta_0 = -\theta_T/2°$,
$\theta_T$ represents a total target scanning angle, and
$\theta_f$ is $\theta_T/N$.

3. The chip of claim 1, wherein each LIDAR output signal is associated with an index n=1 through N and a scan angle for LIDAR output signal n ($\theta_n$) is different for each LIDAR output signal and includes angles in a range from $\theta_n$ to $\theta_n'$ where $\theta_n = (2n-2-N)\theta_T/2N$ and $\theta_n' = (2n-N)\theta_T/2N$, and $\theta_T$ represents a total target scanning angle.

4. The chip of claim 1, wherein each component assembly includes a waveguide configured to carry an outgoing light signal, a splitter configured to receive the outgoing light signal and divide the outgoing light signal into output signals, and steering waveguides that are each configured to receive one of the output signals from the splitter.

5. The chip of claim 4, wherein the steering waveguides are arranged such that the output signals exiting from the steering waveguides associated with each of the component assemblies exit from the chip.

6. The chip of claim 5, wherein the output signals exiting from the steering waveguides associated with each of the component assemblies combine to form one of the LIDAR output signals.

7. The chip of claim 6, wherein the steering waveguides each has a diameter or a height greater than or equal to 1 µm and less than or equal to 4 µm.

8. The chip of claim 4, wherein the chip is configured to vary a phase differential between the output signals that are adjacent to one another in each of the component assemblies so as to steer the direction that the LIDAR output signal from the component assembly travels away from the LIDAR chip.

9. The chip of claim 1, wherein the chip is configured to steer the LIDAR output signals to different sample locations in a field of view and the chip is configured to generate at least $mP_T/t_T$ LIDAR output signals where $P_T$ is the total number of sample locations in the field of view, $t_T$ is total time to measure all of the sample locations, and m is the time needed to take the measurement of a single sample location.

10. The chip of claim 9, wherein the field of view includes the sample locations arranged in in sets of parallel lines where each sample location is included in one line from the first set of parallel lines and also in one line from the second set of parallel lines;
and the chip is configured to generate N LIDAR output signals where N is greater than or equal to $P_{d1}/n_c$ where $n_c$ is less than or equal to $(t_T/m*P_{d2})$,
$P_{d1}$ is the number of lines in a first set of parallel lines,
$P_{d2}$ is the number of lines in a first set of parallel lines,
$n_c$ is a positive integer that is greater than zero, and
N is a positive integer that is greater than zero and less than the higher of $P_{d1}$ or $P_{d2}$.

11. The chip of claim 10, wherein N is greater than or equal to 12.

12. The chip of claim 10, wherein N is greater than or equal to 24.

13. The chip of claim 10, wherein $n_c$ is greater than or equal to 2.

14. The chip of claim 10, wherein m is between 3 and 5 microseconds.

15. The chip of claim 1, wherein each of the component assemblies is included on a different optical chip.

16. The chip of claim 15, wherein each of the optical chips is a silicon-on-insulator chip.

17. The chip of claim 1, wherein each of the component assemblies is configured to combine light from a reference signal with light from a LIDAR input signal, the reference signals and the LIDAR input signal each including light from an outgoing LIDAR signal but the reference signal not including any light that has exited from the chip and the LIDAR input signal including light from a LIDAR output signal that has exited from the chip and been reflected by an object located apart from the chip.

18. A LIDAR chip, comprising:
multiple component assemblies that are each configured to generate and steer a direction of a LIDAR output signal that exits from the chip, the chip configured to generate N LIDAR output signals for resolving a single field of view where N is greater than or equal to $mP_T/t_T$ LIDAR output signals where $P_T$ is the total number of sample locations in the field of view, $t_T$ is total time to measure all of the sample locations in the field of view, and m is the time needed to take the measurement of a single sample location.

19. The chip of claim 18, wherein the field of view includes the sample locations arranged in in sets of parallel lines where each sample location is included in one line from the first set of parallel lines and also in one line from the second set of parallel lines;
and the chip is configured to generate N LIDAR output signals where N is greater than or equal to $P_{d1}/n_c$ where $n_c$ is less than or equal to $(t_T/m*P_{d2})$,
$P_{d1}$ is the number of lines in a first set of parallel lines,
$P_{d2}$ is the number of lines in a first set of parallel lines,
$n_c$ is a positive integer that is greater than zero, and
N is a positive integer that is greater than zero and less than the higher of $P_{d1}$ or $P_{d2}$.

20. The chip of claim 19, wherein N is greater than or equal to 12.

* * * * *